(12) United States Patent
Yamauchi et al.

(10) Patent No.: US 8,908,886 B2
(45) Date of Patent: Dec. 9, 2014

(54) POWER AMPLIFYING APPARATUS AND AUDIO SYSTEM

(75) Inventors: Akira Yamauchi, Yokohama (JP); Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 13/489,098

(22) Filed: Jun. 5, 2012

(65) Prior Publication Data
US 2013/0195289 A1 Aug. 1, 2013

(30) Foreign Application Priority Data
Jan. 26, 2012 (JP) ................................. 2012-014401

(51) Int. Cl.
*H03F 99/00* (2009.01)
(52) U.S. Cl.
USPC ............................ 381/120; 330/298; 330/251
(58) Field of Classification Search
USPC ................................... 381/120; 330/298, 251
See application file for complete search history.

(56) References Cited

U.S. PATENT DOCUMENTS

| 7,557,660 B2 | 7/2009 | Tsurumi | |
| 2010/0259970 A1* | 10/2010 | Toda et al. | 365/148 |

FOREIGN PATENT DOCUMENTS

| JP | 61-81010 | 4/1986 |
| JP | H03-45005 | 2/1991 |
| JP | 2000-151297 A | 5/2000 |
| JP | 2000-165154 | 6/2000 |
| JP | 2003-45005 | 2/2003 |
| JP | 2004-180294 | 6/2004 |
| JP | 2008-92293 | 4/2008 |

OTHER PUBLICATIONS

U.S. Appl. No. 13/418,594, filed Mar. 13, 2012, Hiroyuki Tsurumi.
Japanese Office Action issued Sep. 12, 2014 in Patent Application No. 2012-014401 with English Translation (11 pages).

* cited by examiner

*Primary Examiner* — Creighton Smith
(74) *Attorney, Agent, or Firm* — Oblon, Spivak, McClelland, Maier & Neustadt, L.L.P.

(57) ABSTRACT

The power amplifying apparatus includes a first comparator that compares the first detection signal and the fourth detection signal and outputs a first comparison signal depending on whether or not a difference between the first current and the fourth current is equal to or greater than a first predetermined value. The power amplifying apparatus includes a second comparator that compares the second detection signal and the third detection signal and outputs a second comparison signal depending on whether or not a difference between the second current and the third current is equal to or greater than a second predetermined value.

20 Claims, 12 Drawing Sheets

US 8,908,886 B2

POWER AMPLIFYING APPARATUS AND AUDIO SYSTEM

CROSS-REFERENCE TO RELATED APPLICATION

This application is based upon and claims the benefit of priority from the prior Japanese Patent Application No. 2012-014401, filed on Jan. 26, 2012, the entire contents of which are incorporated herein by reference.

BACKGROUND

1. Field

Embodiments described herein relate generally to a power amplifying apparatus and an audio system.

2. Background Art

Conventional power amplifying apparatuses used as a speaker amplifier of an on-board car audio system include a bridge-tied load (BTL) power amplifying apparatus.

The BTL power amplifying apparatus has a pair of amplifying circuits and therefore has an advantage that it can nominally double both the voltage and current supplied to the speaker and raise the maximum output electric power.

DETAILED DESCRIPTION

Figure 1:
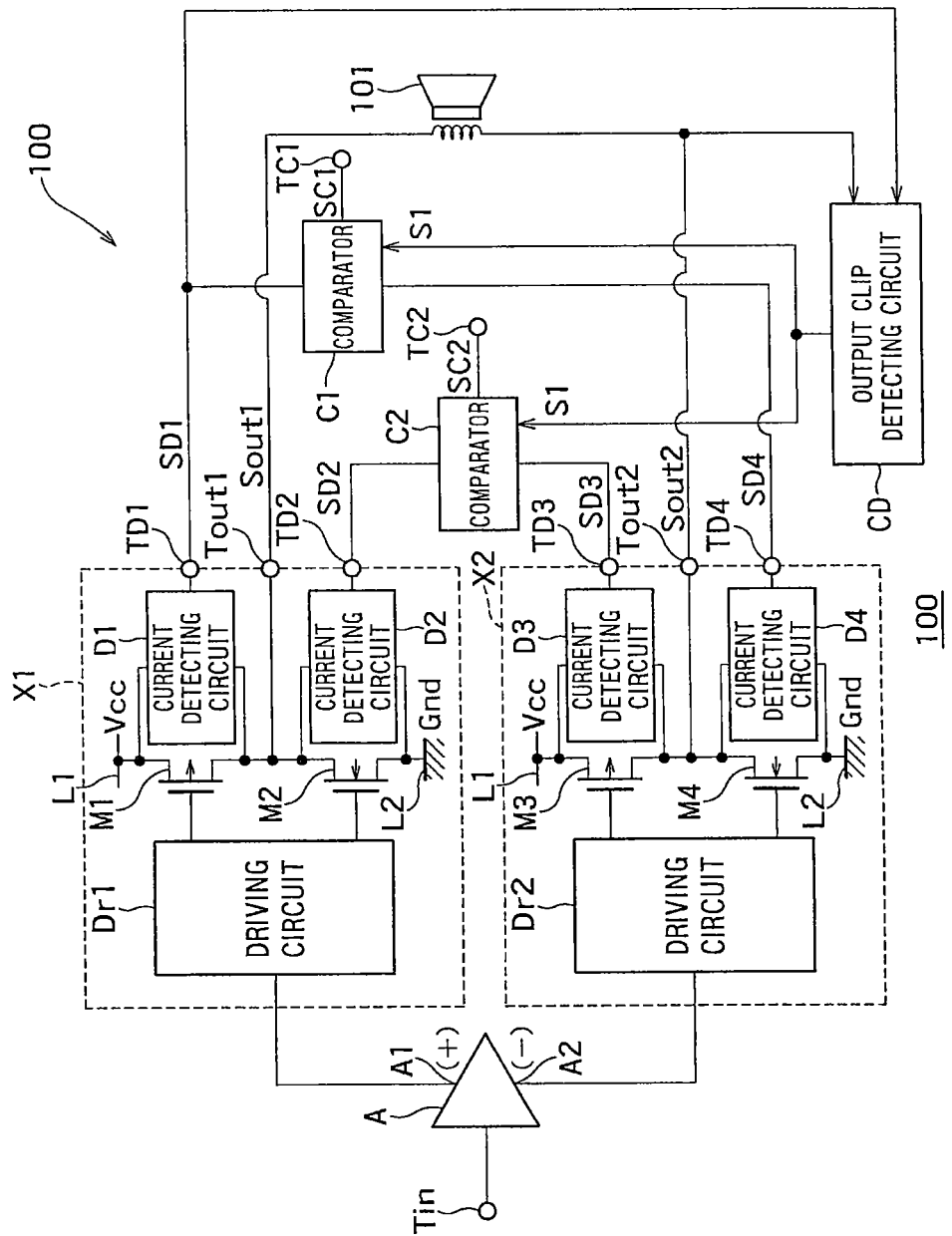
FIG. 1 is a block diagram showing an example of a configuration of an audio system 1000 according to a first embodiment.

A power amplifying apparatus according to an embodiment includes an amplifier that amplifies an input signal input to an input terminal to produce a first amplified signal and a second amplified signal and outputs the first amplified signal at a positive-phase output terminal and the second amplified signal at a negative-phase output terminal. The power amplifying apparatus includes a first amplifying circuit that has a first output transistor that is connected at a first end thereof to a power supply line to which a power supply potential is applied and at a second end thereof to a first output terminal at which a first output signal is output, a first current detecting circuit that detects a first current flowing through the first output transistor and outputs a first detection signal based on a result of the detection to a first detection terminal, a second output transistor that is connected to the first output terminal at a first end thereof and at a second end thereof to a ground line to which a ground potential is applied, a second current detecting circuit that detects a second current flowing through the second output transistor and outputs a second detection signal based on a result of the detection to a second detection terminal, and a first driving circuit that performs a control depending on the first amplified signal so that the first output transistor and the second output transistor are turned on and off in a complementary manner. The power amplifying apparatus includes a second amplifying circuit that has a third output transistor that is connected at a first end thereof to the power supply line and at a second end thereof to a second output terminal at which a second output signal is output, a third current detecting circuit that detects a third current flowing through the third output transistor and outputs a third detection signal based on a result of the detection to a third detection terminal, a fourth output transistor that is connected to the second output terminal at a first end thereof and to the ground line at a second end thereof, a fourth current detecting circuit that detects a fourth current flowing through the fourth output transistor and outputs a fourth detection signal based on a result of the detection to a fourth detection terminal, and a second driving circuit that performs a control depending on the second amplified signal so that the third output transistor and the first output transistor are turned on and off in a complementary manner and the third output transistor and the fourth output transistor are turned on and off in a complementary manner. The power amplifying apparatus includes a first comparator that compares the first detection signal and the fourth detection signal and outputs a first comparison signal depending on whether or not a difference between the first current and the fourth current is equal to or greater than a first predetermined value. The power amplifying apparatus includes a second comparator that compares the second detection signal and the third detection signal and outputs a second comparison signal depending on whether or not a difference between the second current and the third current is equal to or greater than a second predetermined value.

For example, in a multi-channel power amplifying system having a plurality of BTL amplifying circuit apparatuses, a state occurs in which an output terminal to connect to a speaker is connected to an output terminal for a different channel (cross/wrong connection state). If this state occurs, the amplifying circuits drive a short-circuit current determined by the wiring resistance of the wrong connection wire and the offset voltage between the wrongly connected channels.

The offset voltage within a channel is typically controlled to fall within a predetermined range by the feedback action of the amplifying circuits. However, in many cases, offset voltages between different channels are not controlled.

Consequently, various short-circuit currents occur in the cross/wrong connection state, and the level of the power loss that occurs in the output transistor varies with the short-circuit current.

Typically, the amplifying circuit has a protecting circuit that prevents safe operating area (SOA) failure of the output transistor because of a power loss in an overload state. However, the level of the power loss that occurs in the cross/wrong connection state varies, so that it is possible that the level of the power loss is insufficient for the sensitivity of the protecting circuit.

In many cases, the sensitivity of the protecting circuit is designed without taking into consideration a long-term SOA, in order to satisfy the requirements of both high load driving capability and small chip area.

Therefore, when a power loss occurs in an output transistor in the cross/wrong connection state, if the output transistor is left as it is for a certain length of time, the power loss exceeds SOA, which is inversely proportional to the duration of the power loss, and the output transistor fails.

In the recent trend toward eco-cars, on-board systems that stop idling of the engine when the car stops running are attracting increasing attention. These systems cause an instantaneous drop and rise of the power supply potential of the car audio systems with high frequency.

A mainstream power amplifying apparatus is a system that changes the output potential of the amplifying circuit to prevent audio interruption even when such a power supply potential change occurs. However, if the output potential is changed while trying to prevent audio interruption, a temporary power unbalance occurs in the push-pull output transistor, and the protective action is triggered to cause audio interruption.

In view of such circumstances, according to an embodiment, there is provided a power amplifying apparatus and an audio system that can properly detect a wrong connection between output terminals even if an instantaneous drop or rise of the power supply potential occurs when idling is stopped.

In the following, the embodiment will be described with reference to the drawings. In the following, a BTL power amplifying apparatus will be described as an example.

(First Embodiment)

FIG. 1 is a block diagram showing an example of a configuration of an audio system 1000 according to a first embodiment.

As shown in FIG. 1, the audio system 1000 includes a power amplifying apparatus 100 and a speaker 101.

The power amplifying apparatus 100 is configured to amplify a signal input to an input terminal "Tin" and output the resulting amplified electric power to between a first output terminal "Tout1" and a second output terminal "Tout2". The speaker 101 is connected between the first output terminal "Tout1" and the second output terminal "Tout2" and is driven by the electric power supplied from the power amplifying apparatus 100.

The power amplifying apparatus 100 is configured to output a signal determined by whether the speaker 101 is properly connected or not at first and second comparison result terminals "TC1" and "TC2".

The power amplifying apparatus 100 includes an amplifier "A", a first amplifying circuit "X1", a second amplifying circuit "X2", a first comparator "C1", a second comparator "C2", and an output clip detecting circuit "CD", as shown in FIG. 1.

The amplifier "A" is configured to amplify the input signal input to the input terminal "Tin" to produce a first amplified signal and a second amplified signal and output the first amplified signal at a positive-phase output terminal "A1" and the second amplified signal at a negative-phase output terminal "A2".

The first amplifying circuit "X1" includes a first output transistor (pMOS transistor) "M1", a second output transistor (nMOS transistor) "M2", a first current detecting circuit "D1", a second current detecting circuit "D2", and a first driving circuit "Dr1".

The first output transistor "M1" is connected at one end (source) thereof to a power supply line "L1" to which a power supply potential "Vcc" is applied and at another end (drain) thereof to the first output terminal "Tout1" at which a first output signal "Sout1" is output.

The first current detecting circuit "D1" is configured to detect a first current flowing through the first output transistor "M1" and output a first detection signal "SD1" based on the detection result to a first detection terminal "TD1".

The second output transistor "M2" is connected to the first output terminal "Tout1" at one end (drain) thereof and at another end (source) thereof to a ground line "L2" to which a ground potential "Gnd" is applied.

The second current detecting circuit "D2" is configured to detect a second current flowing through the second output transistor "M2" and output a second detection signal "SD2" based on the detection result to a second detection terminal "TD2".

The first driving circuit "Dr1" is configured to receive the first amplified signal and output a control signal depending on the first amplified signal to the gates of the first and second output transistors "M1" and "M2" to control the operations of the first and second output transistors "M1" and "M2".

The first driving circuit "Dr1" operates as a push-pull output circuit. That is, the first driving circuit "Dr1" performs a control operation depending on the first amplified signal so that the first output transistor "M1" and the second output transistor "M2" are turned on and off in a complementary manner.

The second amplifying circuit "X2" includes a third output transistor (pMOS transistor) "M3", a fourth output transistor (nMOS transistor) "M4", a third current detecting circuit "D3", a fourth current detecting circuit "D4", and a second driving circuit "Dr2".

The third output transistor "M3" is connected to the power supply line "L1" at one end (source) thereof and at another end (drain) thereof to the second output terminal "Tout2" at which a second output signal "Sout2" is output.

The third current detecting circuit "D3" is configured to detect a third current flowing through the third output transistor "M3" and output a third detection signal "SD3" based on the detection result to a third detection terminal "TD3".

The fourth output transistor "M4" is connected to the second output terminal "Tout2" at one end (drain) thereof and to the ground line "L2" at another end (source) thereof.

The fourth current detecting circuit "D4" is configured to detect a fourth current flowing through the fourth output transistor "M4" and output a fourth detection signal "SD4" based on the detection result to a fourth detection terminal "TD4".

The second driving circuit "Dr2" is configured to receive the second amplified signal and output a control signal depending on the second amplified signal to the gates of the third and fourth output transistors "M3" and "M4" to control the operations of the third and fourth output transistors "M3" and "M4".

The second driving circuit "Dr2" operates as a push-pull output circuit. The second amplified signal has a phase inverse to that of the first amplified signal. That is, the second driving circuit "Dr2" performs a control operation depending on the second amplified signal so that the third output transistor "M3" is turned on and off in a complementary manner to the first output transistor "M1" as well as to the fourth output transistor "M4".

As shown in FIG. 1, the first comparator "C1" is configured to compare the first detection signal "SD1" and the fourth detection signal "SD4" and output to a first comparison result terminal "TC1" a first comparison signal "SC1" determined by whether or not the difference between the first current and the fourth current is equal to or greater than a first predetermined value.

The second comparator "C2" is configured to compare the second detection signal "SD2" and the third detection signal "SD3" and output to a second comparison result terminal "TC2" a second comparison signal "SC2" determined by whether or not the difference between the second current and the third current is equal to or greater than a second predetermined value.

If the first comparison signal "SC1" indicates that the difference between the first current and the fourth current is equal to or greater than the first predetermined value, or if the second comparison signal "SC2" indicates that the difference between the second current and the third current is equal to or greater than the second predetermined value, it is determined that the speaker is not properly connected between the first output terminal "Tout1" and the second output terminal "Tout2" (the cross/wrong connection state described above occurs). The first predetermined value and the second predetermined value may be the same value.

As shown in FIG. 1, the output clip detecting circuit "CD" is configured to detect the first output signal "Sout1" and the second output signal "Sout2" and output a clip detection signal "S1" based on the detection result to control the first comparator "C1" and the second comparator "C2".

Figure 2:
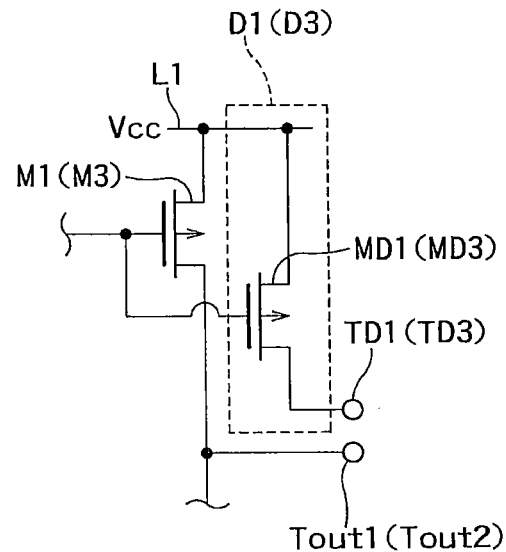
FIG. 2 is a circuit diagram showing an example of a configuration of the first and third current detecting circuits "D1" and "D3" shown in FIG. 1.

FIG. 2 is a circuit diagram showing an example of a configuration of the first and third current detecting circuits "D1" and "D3" shown in FIG. 1. In FIG. 2, the reference symbols for the third current detecting circuit "D3" are shown in parentheses. As shown in FIG. 2, the first current detecting circuit "D1" and the third current detecting circuit "D3" can have the same circuit configuration.

As shown in FIG. 2, the first current detecting circuit "D1" includes a first detecting transistor (pMOS transistor) "MD1", for example.

The first detecting transistor "MD1" is connected to the power supply line "L1" at one end (source) thereof, to the first detection terminal "TD1" at another end (drain) thereof and to the gate of the first output transistor "M1" at the gate thereof. A first detection current, which is a mirror of the first current flowing through the first output transistor "M1", flows through the first detecting transistor "MD1".

That is, the first current detecting circuit "D1" outputs the first detection current from the first detection terminal "TD1" as the first detection signal "SD1".

Similarly, as shown in FIG. 2, the third current detecting circuit "D3" includes a third detecting transistor (pMOS transistor) "MD3", for example.

The third detecting transistor "MD3" is connected to the power supply line "L1" at one end (source) thereof, to the third detection terminal "TD3" at another end (drain) thereof and to the gate of the third output transistor "M3" at the gate thereof. A third detection current, which is a mirror of the third current flowing through the third output transistor "M3", flows through the third detecting transistor "MD3".

That is, the third current detecting circuit "D3" outputs the third detection current from the third detection terminal "TD3" as the third detection signal "SD3".

The first output transistor "M1" is designed to have the same size as the third output transistor "M3".

In this case, a first mirror ratio of the first detection current to the first current is set to be equal to a third mirror ratio of the third detection current to the third current.

Figure 3:
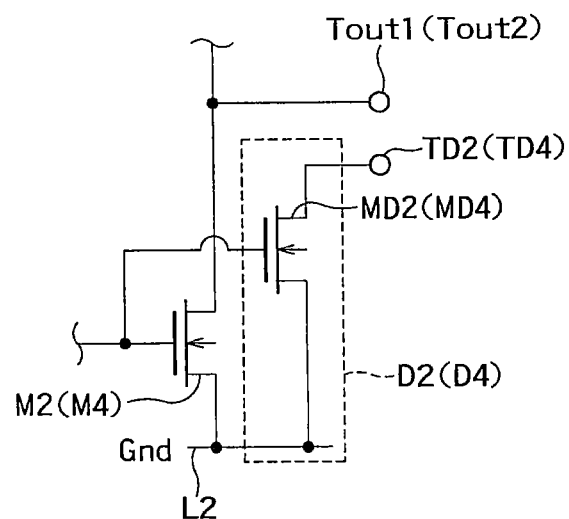
FIG. 3 is a circuit diagram showing an example of a configuration of the second and fourth current detecting circuits "D2" and "D4" shown in FIG. 1.

FIG. 3 is a circuit diagram showing an example of a configuration of the second and fourth current detecting circuits "D2" and "D4" shown in FIG. 1. In FIG. 3, the reference symbols for the fourth current detecting circuit "D4" are shown in parentheses. As shown in FIG. 3, the second current detecting circuit "D2" and the fourth current detecting circuit "D4" can have the same circuit configuration.

As shown in FIG. 3, the second current detecting circuit "D2" includes a second detecting transistor (nMOS transistor) "MD2", for example.

The second detecting transistor "MD2" is connected to the ground line "L2" at one end (source) thereof, to the second detection terminal "TD2" at another end (drain) thereof and to the gate of the second output transistor "M2" at the gate thereof. A second detection current, which is a mirror of the second current flowing through the second output transistor "M2", flows through the second detecting transistor "MD2".

That is, the second current detecting circuit "D2" outputs the second detection current from the second detection terminal "TD2" as the second detection signal "SD2".

Similarly, as shown in FIG. 3, the fourth current detecting circuit "D4" includes a fourth detecting transistor (nMOS transistor) "MD4".

The fourth detecting transistor "MD4" is connected to the ground line "L2" at one end (source) thereof, to the fourth detection terminal "TD4" at another end (drain) thereof and to the gate of the fourth output transistor "M4" at the gate thereof. A fourth detection current, which is a mirror of the fourth current flowing through the fourth output transistor "M4", flows through the fourth detecting transistor "MD4".

That is, the fourth current detecting circuit "D4" outputs the fourth detection current from the fourth detection terminal "TD4" as the fourth detection signal "SD4".

The second output transistor "M2" is designed to have the same size as the fourth output transistor "M4".

In this case, a second mirror ratio of the second detection current to the second current is set to be equal to a fourth mirror ratio of the fourth detection current to the fourth current.

Next, a specific example of a circuit configuration of the first and second comparators "C1" and "C2" shown in FIG. 1 will be described.

Figure 4:
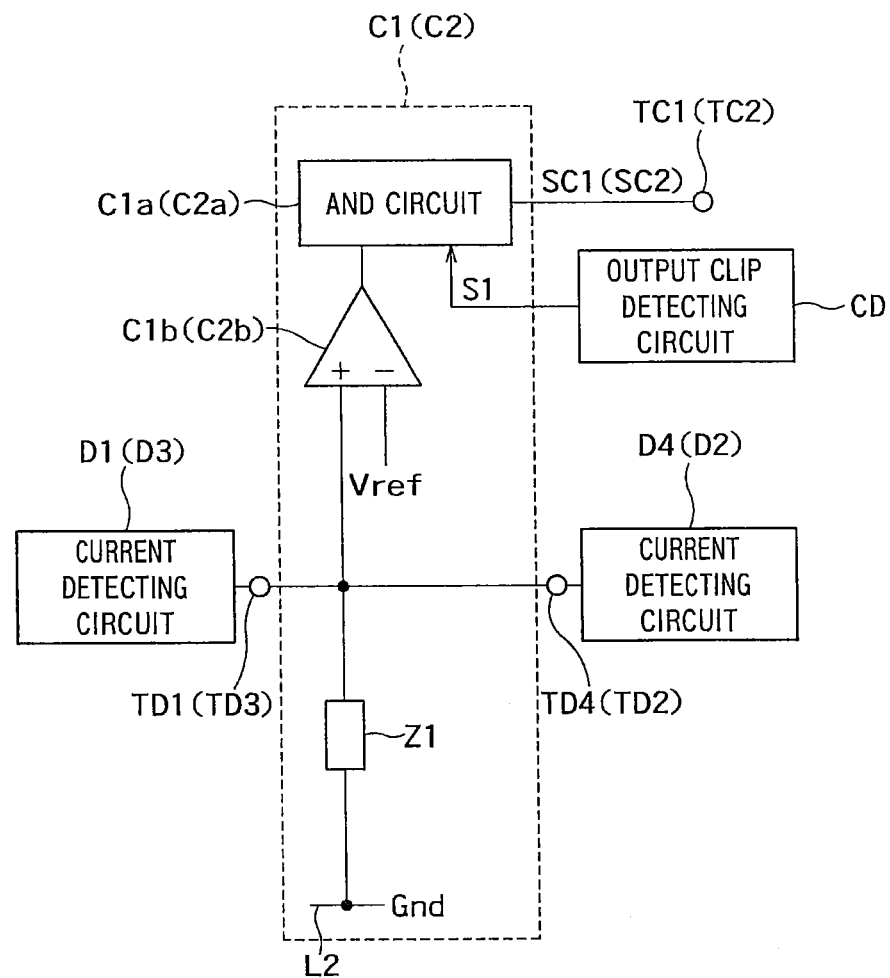
FIG. 4 is a circuit diagram showing an example of a configuration of the first and second comparators "C1" and "C2" shown in FIG. 1.

FIG. 4 is a circuit diagram showing an example of a configuration of the first and second comparators "C1" and "C2" shown in FIG. 1. The configuration shown in FIG. 4 detects that a greater current flows through the first output transistor "M1" or third output transistor "M3". In FIG. 4, the reference symbols for the second comparator "C2" are shown in parentheses. As shown in FIG. 4, the first comparator "C1" and the second comparator "C2" can have the same configuration.

As shown in FIG. 4, the first comparator "C1" has an input resistor "Z1", a calculating circuit "C1a", and a comparator "C1b". The input resistor "Z1" is connected to the first detection terminal "TD1" and the fourth detection terminal "TD4" at one end thereof and to a fixed potential (ground line "L2") at the other end.

The comparator "C1b" is connected to the one end of the input resistor "Z1" at a first input (non-inverting input terminal) thereof, and a reference voltage "Vref" is applied to a second input (inverting input terminal) of the comparator "C1b". The reference voltage Vref is higher than the ground potential "Gnd" (Vref>Gnd).

The calculating circuit "C1a" performs a calculation of the signal output from the comparator "C1b" and the clip detection signal "S1" output from the output clip detecting circuit "CD" and outputs the resulting first comparison signal "SC1".

For example, as shown in FIG. 4, the calculating circuit "C1a" is an AND circuit that performs an AND calculation of the signal output from the comparator "C1b" and the clip detection signal "S1" and outputs the result of the AND calculation as the first comparison signal "SC1".

If the clip detection signal "S1" is at a "Low" level (that is, the first and second output terminals "Tout1" and "Tout2" are clipped to the power supply side or the ground side), the output of the AND circuit is fixed to a "Low" level.

On the other hand, if the clip detection signal "S1" is at a "High" level (that is, the first and second output terminals "Tout1" and "Tout2" are not clipped to the power supply side or the ground side), the output of the AND circuit varies with the signal output from the comparator "C1b". That is, in this case, the first comparator "C1" outputs the first comparison signal "SC1" according to the signal output from the comparator "C1b".

The input resistance "Z1" and the reference voltage "Vref" are set to be appropriate for determination of the current detection sensitivity. The comparator is configured to determine whether or not the result of the calculation by the current detecting circuit is equal to or higher than the reference voltage, and to output the determination result to the AND circuit.

The calculating circuit "C2a" performs a calculation of the signal output from the comparator "C2b" and the clip detection signal "S1" output from the output clip detecting circuit "CD" and outputs the resulting second comparison signal "SC2".

For example, as shown in FIG. 4, the calculating circuit "C2a" is an AND circuit that performs an AND calculation of the signal output from the comparator "C2b" and the clip detection signal "S1" and outputs the result of the AND calculation as the second comparison signal "SC2".

If the clip detection signal "S1" is at the "Low" level (that is, the first and second output terminals "Tout1" and "Tout2" are clipped to the power supply side or the ground side), the output of the AND circuit is fixed to the "Low" level.

On the other hand, if the clip detection signal "S1" is at the "High" level (that is, the first and second output terminals "Tout1" and "Tout2" are not clipped to the power supply side or the ground side), the output of the AND circuit varies with the signal output from the comparator "C2b". That is, in this case, the second comparator "C2" outputs the second comparison signal "SC2" according to the signal output from the comparator "C2b".

As described above, the input resistance "Z1" and the reference voltage "Vref" are set to be appropriate for determination of the current detection sensitivity. The comparator is configured to determine whether or not the result of the calculation by the current detecting circuit is equal to or higher than the reference voltage, and to output the determination result to the AND circuit.

Figure 5:
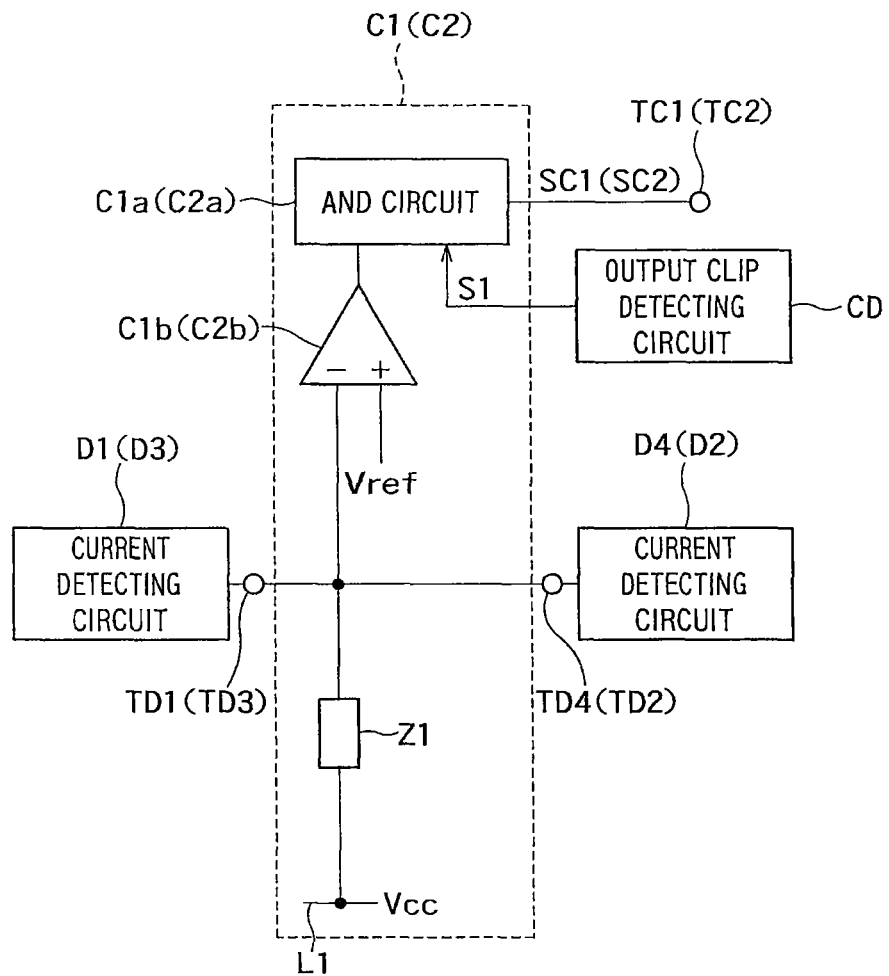
FIG. 5 is a circuit diagram showing an example of the configuration of the first and second comparators "C1" and "C2" shown in FIG. 1.

FIG. 5 is a circuit diagram showing an example of the configuration of the first and second comparators "C1" and "C2" shown in FIG. 1. The configuration shown in FIG. 5 detects that a greater current flows through the fourth output transistor "M4" or second output transistor "M2". In FIG. 5, the reference symbols for the second comparator "C2" are shown in parentheses. As shown in FIG. 5, the first comparator "C1" and the second comparator "C2" can have the same configuration.

As shown in FIG. 5, the first comparator "C1" has an input resistor "Z1", a calculating circuit "C1a", and a comparator "C1b". The input resistor "Z1" is connected to the first detection terminal "TD1" and the fourth detection terminal "TD4" at one end thereof and to a fixed potential (power supply line "L1") at the other end.

The comparator "C1b" is connected to the one end of the input resistor "Z1" at a second input (inverting input terminal) thereof, and a reference voltage "Vref" is applied to a first input (non-inverting input terminal) of the comparator "C1b". The reference voltage Vref is lower than the power supply potential "Vcc" (Vref<Vcc).

The calculating circuit "C1a" performs a calculation of the signal output from the comparator "C1b" and the clip detection signal "S1" output from the output clip detecting circuit "CD" and outputs the resulting first comparison signal "SC1".

For example, as shown in FIG. 5, the calculating circuit "C1a" is an AND circuit that performs an AND calculation of the signal output from the comparator "C1b" and the clip detection signal "S1" and outputs the result of the AND calculation as the first comparison signal "SC1".

If the clip detection signal "S1" is at a "Low" level (that is, the first and second output terminals "Tout1" and "Tout2" are clipped to the power supply side or the ground side), the output of the AND circuit is fixed to a "Low" level.

On the other hand, if the clip detection signal "S1" is at a "High" level (that is, the first and second output terminals "Tout1" and "Tout2" are not clipped to the power supply side or the ground side), the output of the AND circuit varies with the signal output from the comparator "C1b". That is, in this case, the first comparator "C1" outputs the first comparison signal "SC1" according to the signal output from the comparator "C1b".

The input resistance "Z1" and the reference voltage "Vref" are set to be appropriate for determination of the current detection sensitivity. The comparator is configured to determine whether or not the result of the calculation by the current detecting circuit is equal to or lower than the reference voltage, and to output the determination result to the AND circuit.

The calculating circuit "C2a" performs a calculation of the signal output from the comparator "C2b" and the clip detection signal "S1" output from the output clip detecting circuit "CD" and outputs the resulting second comparison signal "SC2".

For example, as shown in FIG. 5, the calculating circuit "C2a" is an AND circuit that performs an AND calculation of the signal output from the comparator "C2b" and the clip detection signal "S1" and outputs the result of the AND calculation as the second comparison signal "SC2".

If the clip detection signal "S1" is at the "Low" level (that is, the first and second output terminals "Tout1" and "Tout2" are clipped to the power supply side or the ground side), the output of the AND circuit is fixed to the "Low" level.

On the other hand, if the clip detection signal "S1" is at the "High" level (that is, the first and second output terminals "Tout1" and "Tout2" are not clipped to the power supply side or the ground side), the output of the AND circuit varies with the signal output from the comparator "C2b". That is, in this case, the second comparator "C2" outputs the second comparison signal "SC2" according to the signal output from the comparator "C2b".

As described above, the input resistance "Z1" and the reference voltage "Vref" are set to be appropriate for determination of the current detection sensitivity. The comparator is configured to determine whether or not the result of the calculation by the current detecting circuit is equal to or lower than the reference voltage, and to output the determination result to the AND circuit.

Figure 6:
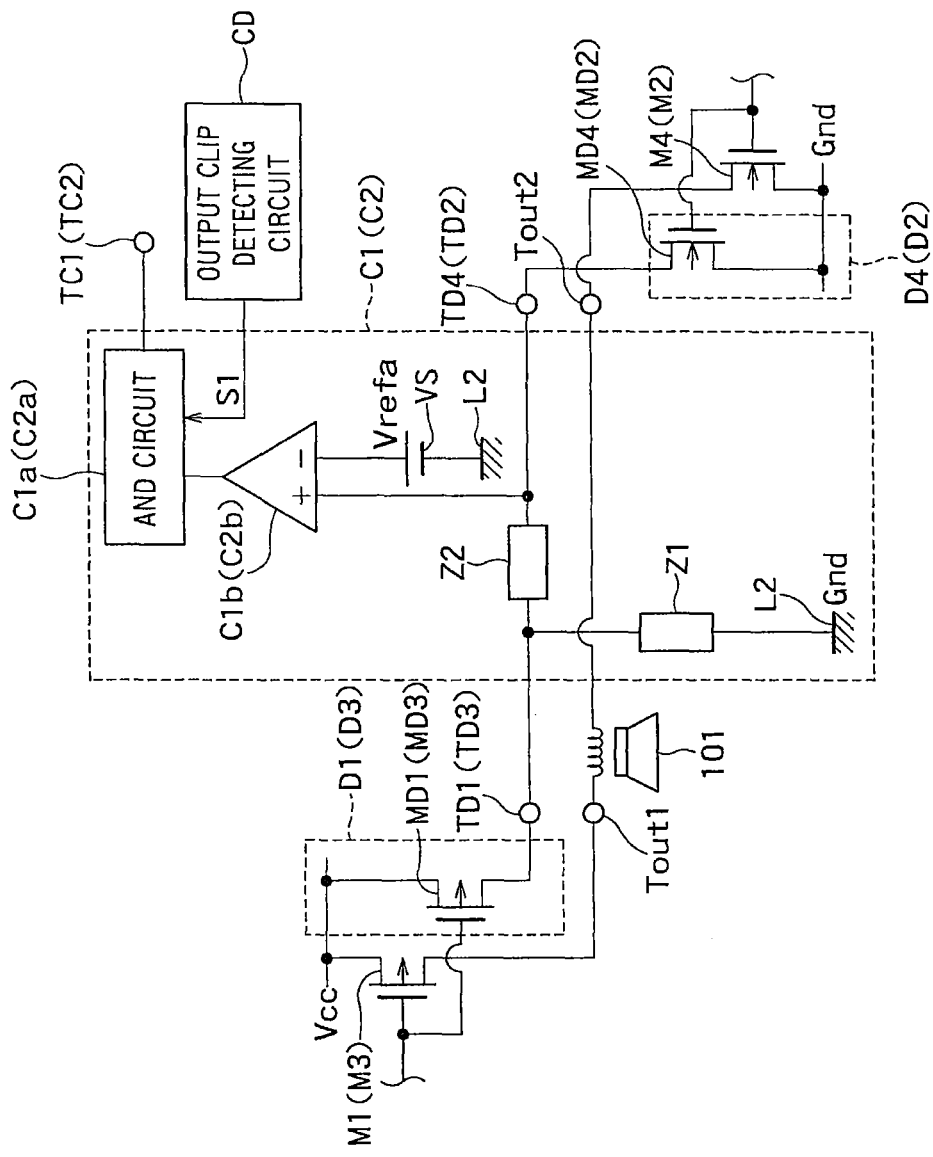
FIG. 6 is a circuit diagram showing another example of the configuration of the first and second comparators "C1" and "C2" shown in FIG. 1.

FIG. 6 is a circuit diagram showing another example of the configuration of the first and second comparators "C1" and "C2" shown in FIG. 1. In FIG. 6, the reference symbols for the second comparator "C2" are shown in parentheses. As shown in FIG. 6, the first comparator "C1" and the second comparator "C2" can have the same circuit configuration.

As shown in FIG. 6, the first comparator "C1" (second comparator "C2") has the same circuit configuration as shown in FIG. 4 except that it further has a direct-current power supply "VS" and a sensitivity reducing resistor "Z2".

The sensitivity reducing resistor "Z2" is connected to the one end of the input resistor "Z1" at one end thereof and to the first input (non-inverting input terminal) of the comparator "C1b" ("C2b") and the fourth detection terminal "TD4" (second detection terminal "TD2") at the other end thereof.

The direct-current power supply "VS" is connected to the second input (inverting input terminal) of the comparator "C1b" ("C2b") at one end (positive electrode) thereof and to a fixed potential (ground line "L2") at the other end (negative electrode) thereof and is configured to generate the reference voltage "Vrefa".

In the example shown in FIG. 6, the other end of the input resistor "Z1" and the other end of the direct-current power supply "VS" are connected only to the ground line "L2".

The comparator "C1b" ("C2b") is configured to determine whether or not the result of the calculation by the first current detecting circuit is equal to or higher than the reference voltage and output the determination result to the AND circuit. The AND circuit outputs the logical product of the logical value from the comparator and the output logic value of the output clip detecting circuit to the comparison result terminal. The sensitivity reducing resistor "Z2" can prevent malfunction during normal operation depending on the ratio thereof to the input resistance "Z1" (when (Z1+Z2)/Z1>1, for example). The circuit configuration shown in FIG. 6 is intended to detect a current unbalance of the first and third output transistors "M1" and "M3".

Figure 7:
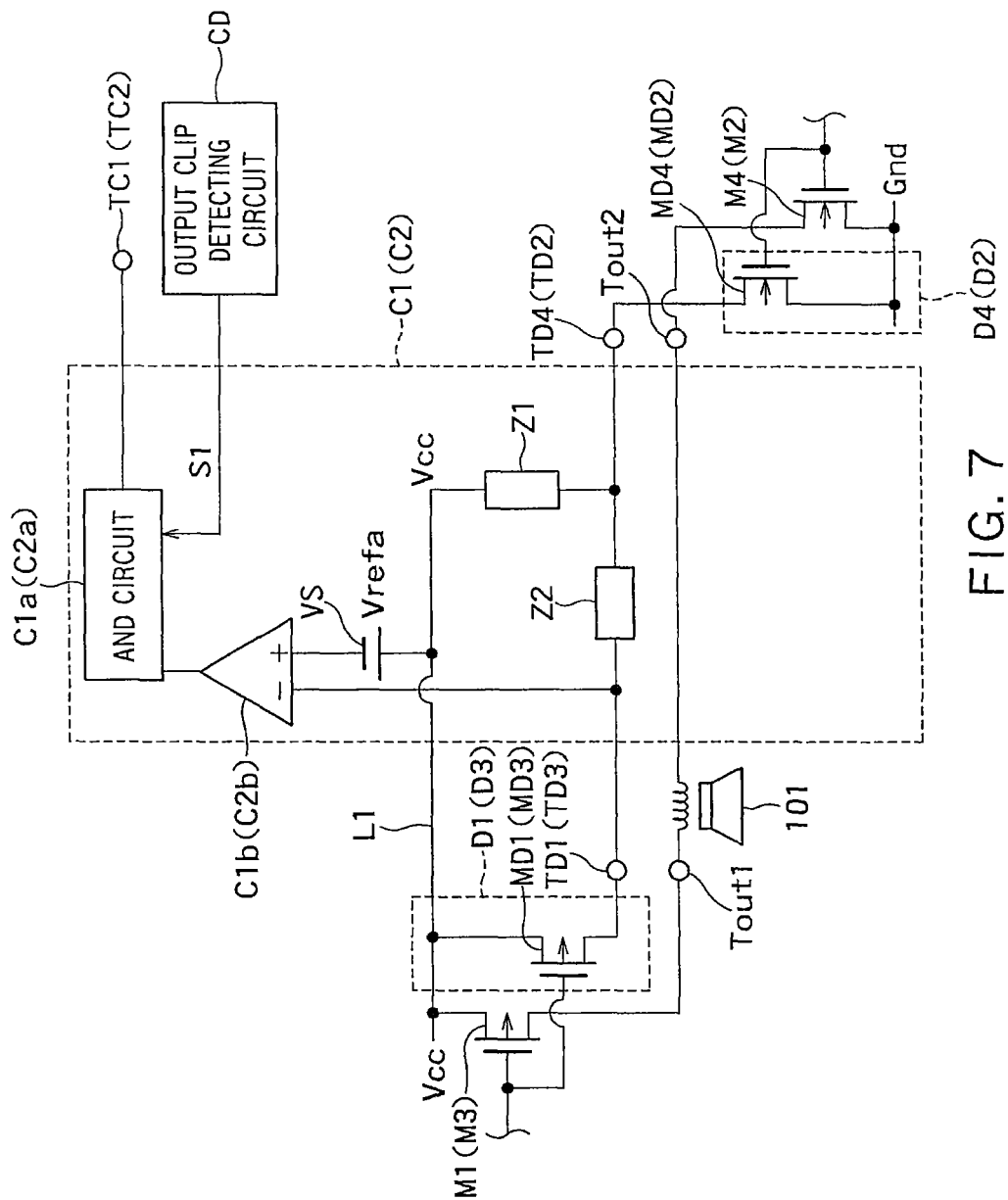
FIG. 7 is a circuit diagram showing another example of the configuration of the first and second comparators "C1" and "C2" shown in FIG. 1.

FIG. 7 is a circuit diagram showing another example of the configuration of the first and second comparators "C1" and "C2" shown in FIG. 1. In FIG. 7, the reference symbols for the second comparator "C2" are shown in parentheses. As shown in FIG. 7, the first comparator "C1" and the second comparator "C2" can have the same circuit configuration.

As shown in FIG. 7, the first comparator "C1" (second comparator "C2") has the same circuit configuration as shown in FIG. 5 except that it further has a direct-current power supply "VS" and a sensitivity reducing resistor "Z2".

The sensitivity reducing resistor "Z2" is connected to the one end of the input resistor "Z1" and the fourth detection terminal "TD4" (second detection terminal "TD2") at one end thereof and to the second input (inverting input terminal) of the comparator "C1b" ("C2b") and the first detection terminal "TD1" (third detection terminal "TD3") at the other end thereof.

The direct-current power supply "VS" is connected to the first input (non-inverting input terminal) of the comparator "C1b" ("C2b") at one end (negative electrode) thereof and to a fixed potential (power supply line "L1") at the other end (positive electrode) thereof and is configured to generate the reference voltage "Vrefa".

In the example shown in FIG. 7, the other end of the input resistor "Z1" and the other end of the direct-current power supply "VS" are connected only to the power supply line "L1".

The comparator "C1b" ("C2b") is configured to determine whether or not the result of the calculation by the first current detecting circuit is equal to or lower than the reference voltage and output the determination result to the AND circuit. The AND circuit outputs the logical product of the logical value from the comparator and the output logic value of the output clip detecting circuit to the comparison result terminal. The sensitivity reducing resistor "Z2" can prevent malfunction during normal operation depending on the ratio thereof to the input resistance "Z1" (when (Z1+Z2)/Z1>1, for example). The circuit configuration shown in FIG. 7 is intended to detect a current unbalance of the second and fourth output transistors "M2" and "M4".

Next, a specific example of a circuit configuration of the output clip detecting circuit "CD" shown in FIG. 1 will be described.

Figure 8:
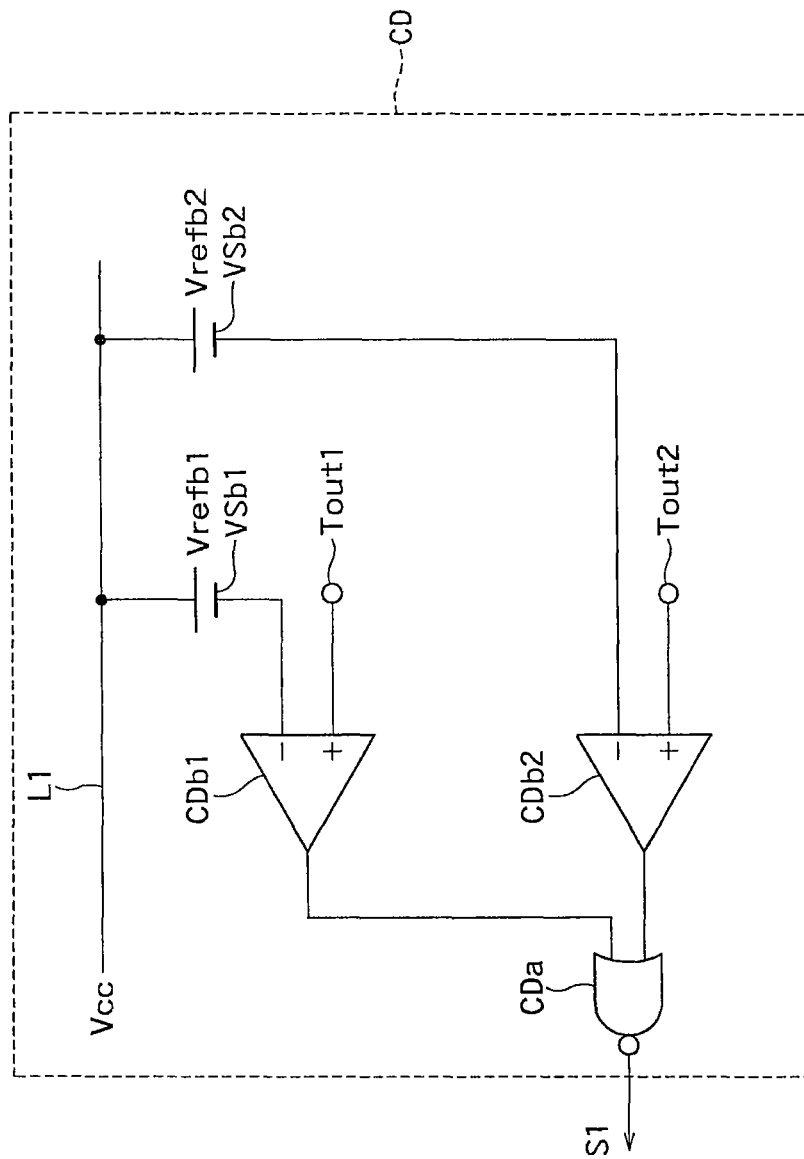
FIG. 8 is a circuit diagram showing an example of a configuration of the output clip detecting circuit "CD" shown in FIG. 1.

FIG. 8 is a circuit diagram showing an example of a configuration of the output clip detecting circuit "CD" shown in FIG. 1.

As shown in FIG. 8, the output clip detecting circuit "CD" includes a NOR circuit "CDa", a first power-supply-side direct-current power supply "VSb1", a second power-supply-side direct-current power supply "VSb2", a first power-supply-side comparator "CDb1", and a second power-supply-side comparator "CDb2".

The first power-supply-side direct-current power supply "VSb1" is connected to the power supply line "L1" at the positive electrode thereof and is configured to output a first power-supply-side reference voltage "Vrefb1".

The second power-supply-side direct-current power supply "VSb2" is connected to the power supply line "L1" at the positive electrode thereof and is configured to output a second power-supply-side reference voltage "Vrefb2".

The first power-supply-side comparator "CDb1" is connected to the negative electrode of the first power-supply-side direct-current power supply "VSb1" at the inverting input terminal thereof and to the first output terminal "Tout1" at the non-inverting input terminal thereof.

The second power-supply-side comparator "CDb2" is connected to the negative electrode of the second power-supply-side direct-current power supply "VSb2" at the inverting input terminal thereof and to the second output terminal "Tout2" at the non-inverting input terminal thereof.

The NOR circuit "CDa" is configured to output the result of a NOR calculation of the outputs of the first and second power-supply-side comparators "CDb1" and "CDb2" as the clip detection signal "S1".

When the first output signal "Sout1" falls within a range between the power supply potential "Vcc" and the first power-supply-side reference voltage "Vrefb1" lower than the power supply potential "Vcc", or when the second output signal "Sout2" falls within a range between the power supply potential "Vcc" and the second power-supply-side reference voltage "Vrefb2" lower than the power supply potential "Vcc", the output clip detecting circuit "CD" shown in FIG. 8 performs a control so that the first comparator "C1" does not output the first comparison signal "SC1" (that is, the output of the first comparator "C1" is set at a fixed value), and the second comparator "C2" does not output the second comparison signal "SC2" (that is, the output of the second comparator "C2" is set at a fixed value).

That is, when the output potential is close to the internal potential "Vcc", detection of a cross/wrong connection does not occur. This advantageously helps prevent malfunction in the presence of signals.

Figure 9:
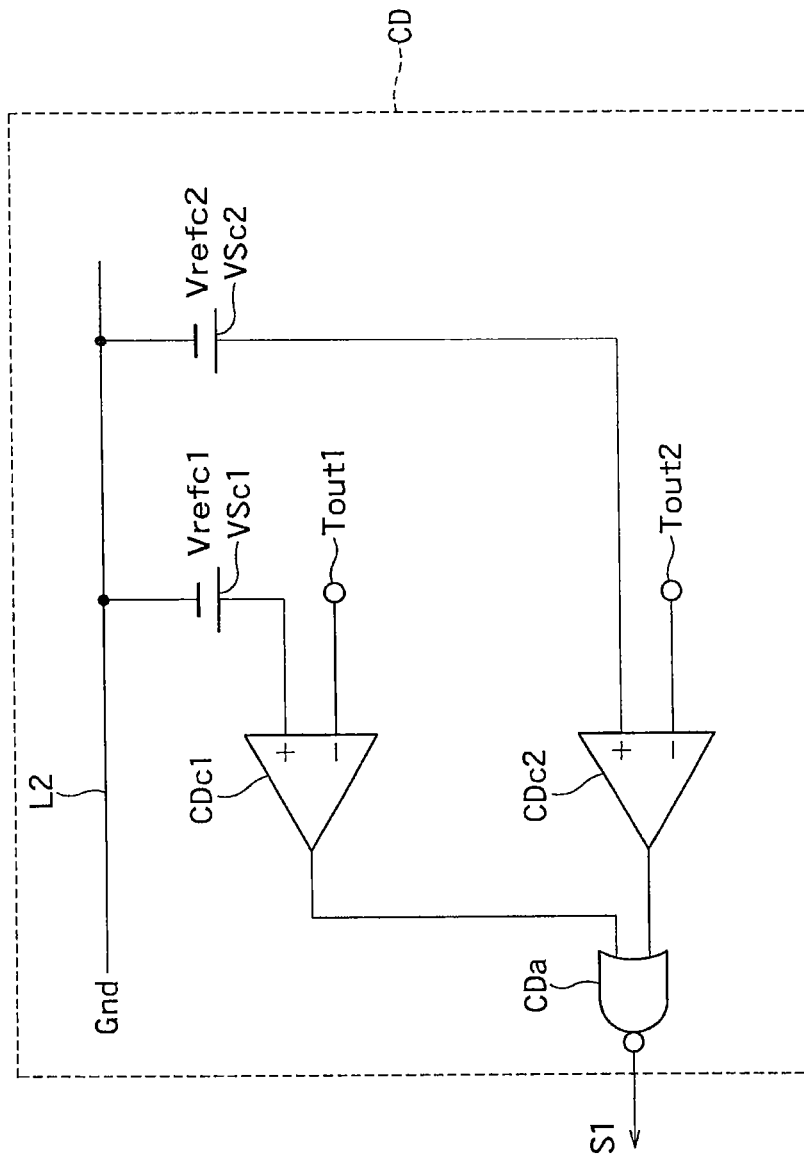
FIG. 9 is a circuit diagram showing another example of the configuration of the output clip detecting circuit "CD" shown in FIG. 1.

FIG. 9 is a circuit diagram showing another example of the configuration of the output clip detecting circuit "CD" shown in FIG. 1.

As shown in FIG. 9, the output clip detecting circuit "CD" includes a NOR circuit "CDa", a first ground-side direct-current power supply "VSc1", a second ground-side direct-current power supply "VSc2", a first ground-side comparator "CDc1", and a second ground-side comparator "CDc 2".

The first ground-side direct-current power supply "VSc1" is connected to the ground line "L2" at the negative electrode thereof and is configured to output a first ground-side reference voltage "Vrefc1".

The second ground-side direct-current power supply "VSc2" is connected to the ground line "L2" at the negative electrode thereof and is configured to output a second ground-side reference voltage "Vrefc2".

The first ground-side comparator "CDc1" is connected to the positive electrode of the first ground-side direct-current power supply "VSc1" at the non-inverting input terminal thereof and to the first output terminal "Tout1" at the inverting input terminal thereof.

The second ground-side comparator "CDc2" is connected to the positive electrode of the second ground-side direct-current power supply "VSc2" at the non-inverting input terminal thereof and to the second output terminal "Tout2" at the inverting input terminal thereof.

The NOR circuit "CDa" is configured to output the result of a NOR calculation of the outputs of the first and second ground-side comparators "CDc1" and "CDc2" as the clip detection signal "S1".

When the first output signal "Sout1" falls within a range between the ground potential "Gnd" and the first ground-side reference voltage "Vrefc1" higher than the ground potential "Gnd", or when the second output signal "Sout2" falls within a range between the ground potential "Gnd" and the second ground-side reference voltage "Vrefc2" higher than the ground potential "Gnd", the output clip detecting circuit "CD" shown in FIG. 9 performs a control so that the first comparator "C1" does not output the first comparison signal "SC1" (that is, the output of the first comparator "C1" is set at a fixed value), and the second comparator "C2" does not output the second comparison signal "SC2" (that is, the output of the second comparator "C2" is set at a fixed value).

Figure 10:
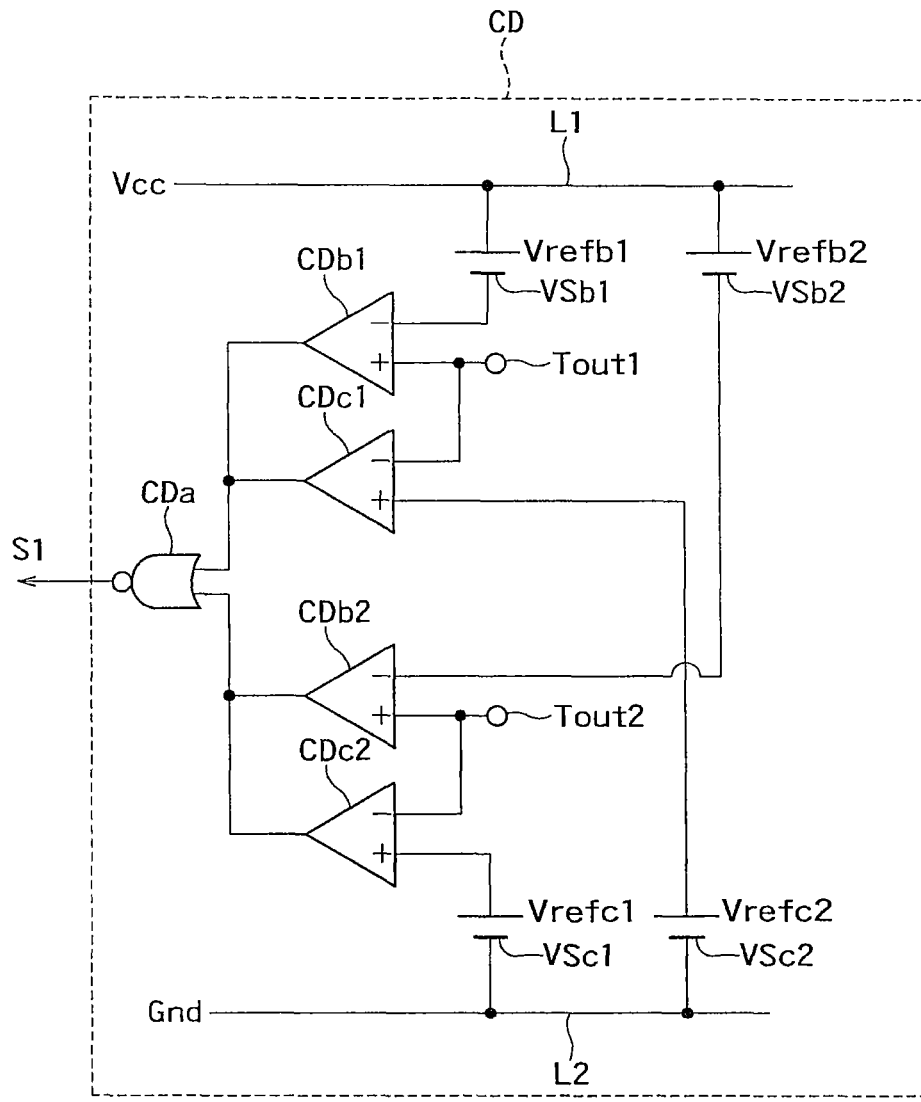
FIG. 10 is a circuit diagram showing another example of the configuration of the output clip detecting circuit "CD" shown in FIG. 1.

FIG. 10 is a circuit diagram showing another example of the configuration of the output clip detecting circuit "CD" shown in FIG. 1.

As shown in FIG. 10, the output clip detecting circuit "CD" includes a NOR circuit "CDa", a first power-supply-side direct-current power supply "VSb1", a second power-supply-side direct-current power supply "VSb2", a first power-supply-side comparator "CDb1", a second power-supply-side comparator "CDb2", a first ground-side direct-current power supply "VSc1", a second ground-side direct-current power supply "VSc2", a first ground-side comparator "CDc1", and a second ground-side comparator "CDc 2".

The first power-supply-side direct-current power supply "VSb1" is connected to the power supply line "L1" at the positive electrode thereof and is configured to output a first power-supply-side reference voltage "Vrefb1".

The second power-supply-side direct-current power supply "VSb2" is connected to the power supply line "L1" at the positive electrode thereof and is configured to output a second power-supply-side reference voltage "Vrefb2".

The first power-supply-side comparator "CDb1" is connected to the negative electrode of the first power-supply-side direct-current power supply "VSb1" at the inverting input terminal thereof and to the first output terminal "Tout1" at the non-inverting input terminal thereof.

The second power-supply-side comparator "CDb2" is connected to the negative electrode of the second power-supply-side direct-current power supply "VSb2" at the inverting input terminal thereof and to the second output terminal "Tout2" at the non-inverting input terminal thereof.

The first ground-side direct-current power supply "VSc1" is connected to the ground line "L2" at the negative electrode thereof and is configured to output a first ground-side reference voltage "Vrefc1".

The second ground-side direct-current power supply "VSc2" is connected to the ground line "L2" at the negative electrode thereof and is configured to output a second ground-side reference voltage "Vrefc2".

The first ground-side comparator "CDc1" is connected to the positive electrode of the second ground-side direct-current power supply "VSc2" at the non-inverting input terminal thereof and to the first output terminal "Tout1" at the inverting input terminal thereof.

The second ground-side comparator "CDc2" is connected to the positive electrode of the first ground-side direct-current power supply "VSc1" at the non-inverting input terminal thereof and to the second output terminal "Tout2" at the inverting input terminal thereof.

The NOR circuit "CDa" is configured to output the result of a NOR calculation of the outputs of the first and second power-supply-side comparators "CDb1" and "CDb2" and the outputs of the first and second ground-side comparators "CDc1" and "CDc2" as the clip detection signal "S1".

When the first output signal "Sout1" falls within a range between the power supply potential "Vcc" and the first power-supply-side reference voltage lower than the power supply potential "Vcc", when the second output signal "Sout2" falls within a range between the power supply potential "Vcc" and the second power-supply-side reference voltage lower than the power supply potential "Vcc", when the first output signal "Sout1" falls within a range between the ground potential "Gnd" and the first ground-side reference voltage higher than the ground potential "Gnd", or when the second output signal "Sout2" falls within a range between the ground potential "Gnd" and the second ground-side reference voltage higher than the ground potential "Gnd", the output clip detecting circuit "CD" shown in FIG. 10 performs a control so that the first comparator "C1" does not output the first comparison signal "SC1" (that is, the output of the first comparator "C1" is set at a fixed value), and the second comparator "C2" does not output the second comparison signal "SC2" (that is, the output of the second comparator "C2" is set at a fixed value).

That is, when the output potential is close to the power supply potential "Vcc" or the ground potential "Gnd", detection of a cross/wrong connection does not occur. This advantageously helps prevent malfunction in the presence of signals.

Next, an operation of the power amplifying apparatus 100 configured as described above in the cross/wrong connection state will be described.

In the following, as an example, a state will be described in which one BTL output terminal for a channel is wrongly connected to an output terminal for a different channel to form a wiring resistance "Rs" in a power amplifier system having multiple channels (a cross/wrong connection state).

Figure 11:
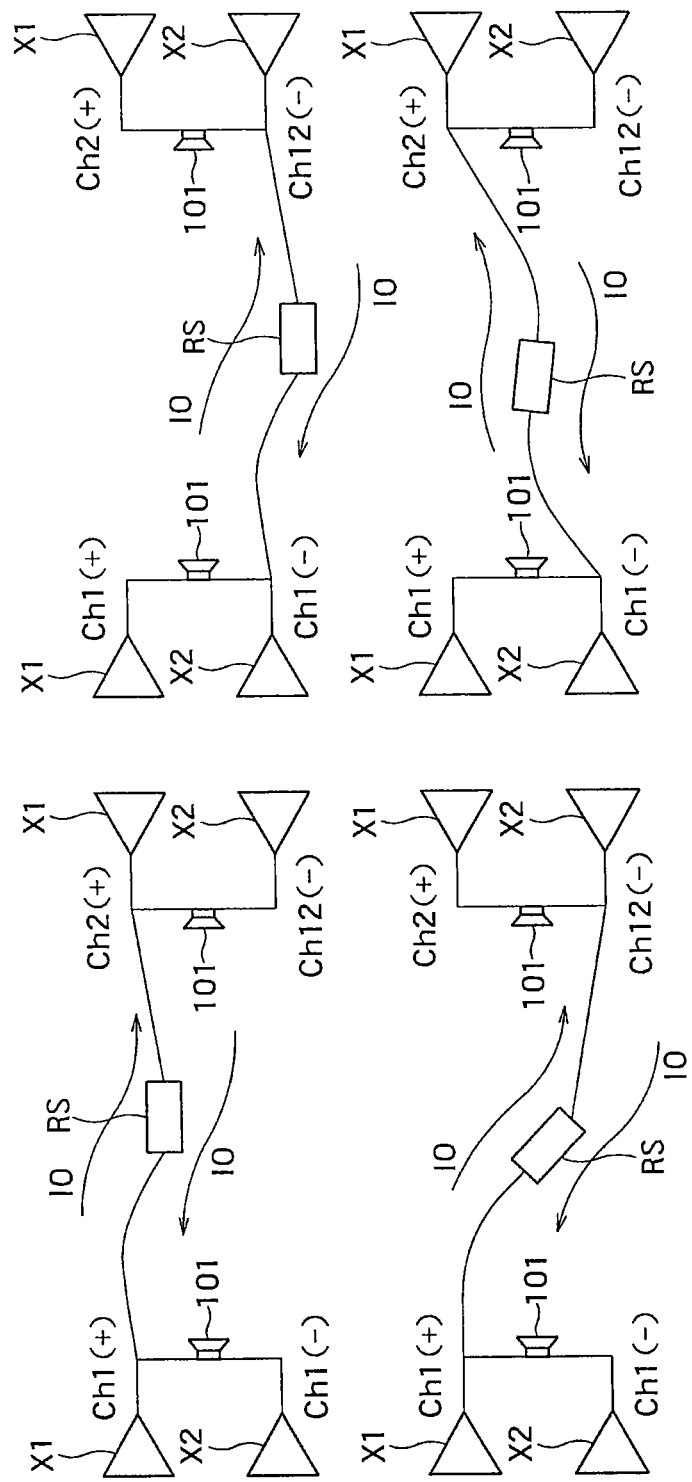
FIG. 11 is a diagram showing four examples of the wrong connection state.

FIG. 11 shows four examples of the wrong connection state. Provided that the offset voltage between the wrongly connected channels is "Vos" (on the assumption that the output terminal voltage of one amplifying circuit 1 is higher than that of the other amplifying circuit), the current "Io (cross_short)" flowing through the wiring resistor "Rs" is expressed by the following formula (1).

$$Io(\text{cross\_short}) = Vos/Rs \quad (1)$$

For example, the first comparator "C1" is intended to detect the cross/wrong connection state. Thus, provided that the current input to the first comparator "C1" is "Iin(COMP)", the input resistance is "Z1", and the reference voltage is "Vref(COMP)", a criterion formula for the cross/wrong connection state is the following formula (2). If this formula holds, the first comparator "C1" determines that the cross/wrong connection state has occurred. (Note that Iin(COMP)=first detection current I(D1)–fourth detection current I(D4)).

$$Iin(COMP) \cdot Z1 > Vref(COMP) \quad (2)$$

Furthermore, in the cross/wrong connection state, a relation of I(D1)>>I(D4) holds, so that the formula (2) can be reduced to the following formula (3).

$$I(D1) \cdot Z1 > Vref(COMP) \quad (3)$$

The current flowing through the first current detecting circuit "D1" is determined by monitoring the current flowing through the output transistor "M1". Therefore, provided the current ratio is 1/m, the final criterion formula is the following formula (4).

$$Io > m \cdot \frac{Vref(COMP)}{Z1} \quad (4)$$

As described above, the criterion formula for the cross/wrong connection involves monitoring only the current flowing through the output transistor. Even if an instantaneous electric power unbalance occurs because of a change of the output potential of the power amplifying apparatus 100 when idling is stopped, the current balance is maintained, so that no malfunction occurs.

As described above, the power amplifying apparatus according to this embodiment can detect a wrong connection between output terminals.

In particular, when a cross/wrong connection occurs in a car audio system, the power amplifying apparatus is protected from a short-circuit current that occurs depending on the wiring resistance of the wrong connection wire and the offset voltage between the wrongly connected channels and furthermore is prevented from malfunctioning when an instantaneous power failure or power supply voltage rise occurs during normal operation, or during transient operation.

(Modification)

In the following, a modification of the first embodiment described above will be described.

Figure 12:
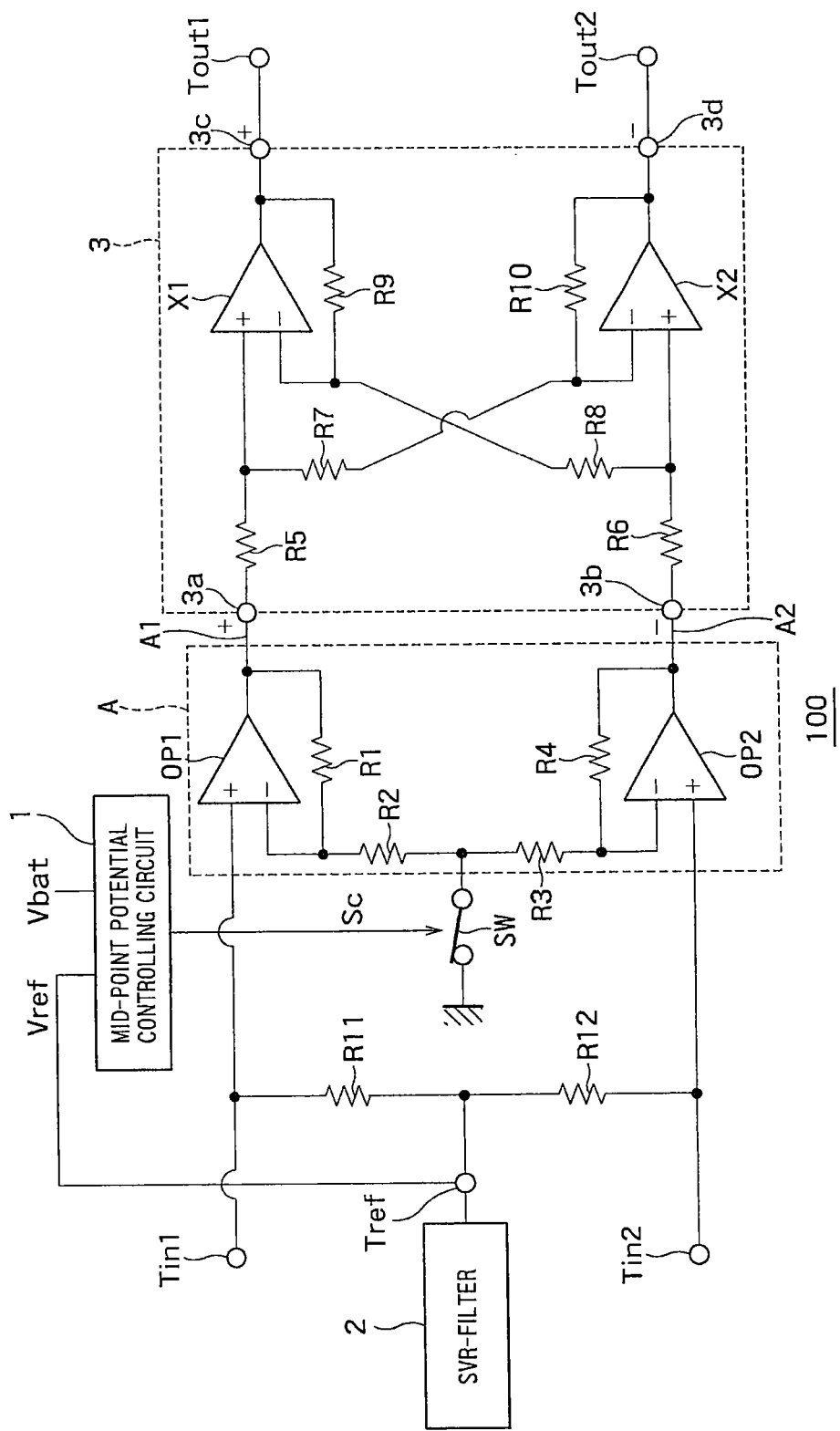
FIG. 12 is a diagram showing a modification of a part of the configuration of the power amplifying apparatus 100.

FIG. 12 is a diagram showing a modification of a part of the configuration of the power amplifying apparatus 100. In FIG. 12, the same reference symbols as those in FIG. 1 denote the same components as those in the first embodiment. The configuration of the part of the power amplifying apparatus 100 that is not shown in FIG. 12 is the same as that shown in FIG. 1.

As shown in FIG. 12, a power amplifying apparatus 200 includes a mid-point potential controlling circuit 1, a fully differential operational amplifier 3, a first feedback resistor "R1", a second feedback resistor "R2", a third feedback resistor "R3", a fourth feedback resistor "R4", a first input resistor "R11", a second input resistor "R12", a first operational amplifier "OP1", a second operational amplifier "OP2" and a switching circuit "SW".

The first feedback resistor "R1", the second feedback resistor "R2", the third feedback resistor "R3", the fourth feedback resistor "R4", the first input resistor "R11", the second input resistor "R12", the first operational amplifier "OP1" and the second operational amplifier "OP2" correspond to the amplifier "A" in FIG. 1. First and second signal input terminals "Tin1" and "Tin2" correspond to the input terminal "Tin" in FIG. 1.

As shown in FIG. 12, the first operational amplifier "OP1" is connected to the first signal input terminal "Tin1" at the non-inverting input terminal thereof.

The first feedback resistor "R1" is connected between the output terminal of the first operational amplifier "OP1" and the inverting input terminal of the first operational amplifier "OP1".

The second feedback resistor "R2" is connected to the inverting input terminal of the first operational amplifier "OP1" at one end thereof.

The second operational amplifier "OP2" is connected to the second signal input terminal "Tin2" at the non-inverting input terminal thereof.

The third feedback resistor "R3" is connected to the inverting input terminal of the second operational amplifier "OP2" at one end thereof and to the other end of the second feedback resistor "R2" at the other end thereof.

The fourth feedback resistor "R4" is connected between the output terminal of the second operational amplifier "OP2" and the inverting input terminal of the second operational amplifier "OP2".

The first to fourth feedback resistors "R1" to "R4" can have a same first resistance "Ra".

The fully differential operational amplifier 3 is connected to the output terminal of the first operational amplifier "OP1" at the non-inverting input terminal thereof, to the output terminal of the second operational amplifier "OP2" at the inverting input terminal thereof, to the first signal output terminal "Tout1" at the non-inverting output terminal thereof, and to the second signal output terminal at the inverting output terminal thereof. The fully differential operational amplifier 3 is configured to maintain a constant differential gain.

As shown in FIG. 12, the fully differential operational amplifier 3 includes a fifth feedback resistor "R5", a sixth feedback resistor "R6", a seventh feedback resistor "R7", an eighth feedback resistor "R8", a ninth feedback resistor "R9", a tenth feedback resistor "R10", a third operational amplifier "X1", and a fourth operational amplifier "X2", for example.

The fifth feedback resistor "R5" is connected to the non-inverting input terminal of the fully differential operational amplifier 3 (output terminal of the first operational amplifier "OP1") at one end thereof.

The sixth feedback resistor "R6" is connected to the inverting input terminal of the fully differential operational amplifier 3 (output terminal of the second operational amplifier "OP2") at one end thereof.

The seventh feedback resistor "R7" is connected to the other end of the fifth feedback resistor "R5" at one end thereof.

The eighth feedback resistor "R8" is connected to the other end of the sixth feedback resistor "R6" at one end thereof.

The third operational amplifier "X1" is connected to the other end of the fifth feedback resistor "R5" at the non-inverting input terminal thereof, to the other end of the eighth feedback resistor "R8" at the inverting input terminal thereof, and to the non-inverting output terminal of the fully differential operational amplifier 3 (first signal output terminal "Tout1") at the output terminal thereof.

The ninth feedback resistor "R9" is connected between the output terminal of the third operational amplifier "X1" and the inverting input terminal of the third operational amplifier "X1".

The fourth operational amplifier "X2" is connected to the other end of the sixth feedback resistor "R6" at the non-inverting input terminal thereof, to the other end of the seventh feedback resistor "R7" at the inverting input terminal thereof, and to the inverting output terminal of the fully differential operational amplifier 3 (second signal output terminal "Tout2") at the output terminal thereof.

The tenth feedback resistor "R10" is connected between the output terminal of the fourth operational amplifier "X2" and the inverting input terminal of the fourth operational amplifier "X2".

The fifth and sixth feedback resistors "R5" and "R6" can have a same second resistance "Rb" in this modification.

The ninth and tenth feedback resistors "R9" and "R10" can have a same third resistance "Rc" in this modification.

According to this modification, the resistances of the seventh and eighth feedback resistors "R7" and "R8" are negligibly smaller than the third resistance "Rc", for example.

The switching circuit "SW" is connected between the other end of the second feedback resistor "R2" and the ground.

The first input resistor "R11" is connected between the first signal input terminal "Tin1" and the reference terminal (SVR terminal) "Tref" to which the reference voltage "Vref" is applied.

The second input resistor "R12" is connected between the second signal input terminal "Tin2" and the reference terminal "Tref".

The reference voltage "Vref" is supplied to the reference terminal "Tref" through the SVR filter 2. The SVR filter 2 divides a power supply potential "Vbat" (Vcc) to generate the reference voltage "Vref" lower than the intermediate voltage of the power supply potential "Vbat", and has a capacitor (not shown) that is connected between the reference terminal "Tref" and the ground and raises the power supply rejection ratio for the generated reference voltage "Vref".

Therefore, the reference voltage "Vref" is stable even if the power supply potential "Vbat" varies when idling is stopped, for example. The reference voltage "Vref" is set to be a quarter of the power supply potential "Vbat", for example.

The mid-point potential controlling circuit 1 is configured to monitor the reference voltage "Vref" and the power supply potential (battery voltage) "Vbat" and control the switching circuit "SW" according to the value of the power supply potential "Vbat".

For example, if the power supply potential "Vbat" is equal to or higher than a preset switching threshold "Vth" (if the power supply potential "Vbat" is in the stable state), the mid-point potential controlling circuit 1 turns on the switching circuit "SW". On the other hand, if the power supply potential "Vbat" is lower than the switching threshold "Vth" (if the power supply potential "Vbat" instantaneously drops), the mid-point potential controlling circuit 1 turns off the switching circuit "SW".

The switching threshold "Vth" is set at the value of the power supply potential "Vbat" that allows the first and second operational amplifiers "OP1" and "OP2" to operate and output a predetermined signal. The switching threshold "Vth" is set based on the reference voltage "Vref". For example, the switching threshold "Vth" is set to be higher than a half of the power supply potential "Vbat" in the stable state. In this case, the mid-point potential controlling circuit 1 controls the switching circuit "SW" based on the result of comparison between the power supply potential "Vbat" and the reference voltage "Vref".

Next, an operation, a gain and a DC operating point of the power amplifying circuit configured as described above will be described.

As described above, the power supply potential "Vbat" is the battery voltage. Besides, the reference terminal "Tref" is a terminal at which a voltage lower than the intermediate voltage of the power supply potential "Vbat", a quarter of the power supply potential "Vbat", for example, is generated, and the power supply rejection ratio is raised by an external capacitor. The input signal is applied to the first signal input terminal "Tin1", and the second signal input terminal "Tin2" is a virtual grounding point.

When the switching circuit "SW" is in the on state, a gain "K1" of the first operational amplifier "OP1" is 2 as shown by the following formula (5).

$$K1 = 1 + R1/R2 = 1 + Ra/Ra = 2 \quad (5)$$

A gain "K2" of the second operational amplifier "OP2" is determined in the same way. Since the second signal input terminal "Tin2" is the virtual grounding point, and the output of the second operational amplifier "OP2" is an alternating-current grounding point, a differential gain "KA" of the differential outputs of the first operational amplifier "OP1" and the second operational amplifier "OP2" is 2 as shown by the following formula (6).

$$KA = K1 - K2 = 2 - 0 = 2 \quad (6)$$

The first operational amplifier "OP1" and the second operational amplifier "OP2" are doubling DC amplifiers, and the reference voltage "Vref" at the reference terminal "Tref" is set to be a quarter of the power supply potential "Vbat" in the stable state. Therefore, the output potentials of the first operational amplifier "OP1" and the second operational amplifier "OP2" are a half of the power supply potential "Vbat", that is, the intermediate potential of the power supply potential "Vbat".

Next, consider the differential gain of the fully differential operational amplifier 3, that is, the differential gain "KB" from the outputs of the first operational amplifier "OP1" and the second operational amplifier "OP2" to the first signal output terminal "Tout1" and the second signal output terminal "Tout2". The differential gain "KB" is approximately Rc/Rb, since the resistances of the seventh and eighth feedback resistors are negligibly smaller than the resistances of the ninth and tenth feedback resistors as described above.

Therefore, the differential gain of the power amplifying apparatus 200 (the differential output gain of the first signal output terminal "Tout1" and the second signal output terminal "Tout2") K in the case where the input signal is input to the first signal input terminal "Tin1" is calculated according to K=KA×KB=2Rc/Rb.

The output potentials at the first signal output terminal "Tout1" and the second signal output terminal "Tout2" are close to the output potentials of the first operational amplifier "OP1" and the second operational amplifier "OP2" because of the effect of the seventh and eighth feedback resistors "R7" and "R8". If it were not for the seventh and eighth feedback resistors "R7" and "R8", the DC gains of the first and second operational amplifiers "OP1" and "OP2" would be effectively indefinite, and the output potentials "Tout1" and "Tout2" would not be fixed at a desired voltage. Thus, the output potentials at the first signal output terminal "Tout1" and the second signal output terminal "Tout2" are approximately equal to the intermediate potential of the power supply potential "Vbat".

On the other hand, when the switching circuit "SW" is in the off state, the gain "K1" of the first operational amplifier "OP1" is 1.5 as shown by the following formula (7).

$$K1=1+R1/(R2+R3)=1+Ra/(2Ra)=1.5 \quad (7)$$

Similarly, when the switching circuit "SW" is in the off state, the gain "K2" of the second operational amplifier "OP2" is −0.5 as shown by the following formula (8).

$$K2=-R4/(R2+R3)=-Ra/2Ra=-0.5 \quad (8)$$

Thus, the differential gain "KA" of the outputs of the first operational amplifier "OP1" and the second operational amplifier "OP2" is 2 as shown by the following formula (9).

$$KA=K1-K2=1.5-(-0.5)=2 \quad (9)$$

Since the switching circuit "SW" is in the off state, the output potentials of the first operational amplifier "OP1" and the second operational amplifier "OP2" are approximately equal to the potential at the reference terminal "Tref" and therefore a quarter of the power supply potential "Vbat".

The output potentials at the first signal output terminal "Tout1" and the second signal output terminal "Tout2" are close to the output potentials of the first operational amplifier "OP1" and the second operational amplifier "OP2" because of the effect of the seventh and eighth feedback resistors "R7" and "R8". Therefore, the output potentials at the first signal output terminal "Tout1" and the second signal output terminal "Tout2" are approximately equal to a quarter of the power supply potential "Vbat".

In addition, the differential gain "KB" of the fully differential operational amplifier 3 is approximately Rc/Rb, since the resistances of the seventh and eighth feedback resistors are negligibly smaller than the resistances of the ninth and tenth feedback resistors as described above.

Therefore, the differential gain of the power amplifying apparatus 200 (the differential output gain of the first signal output terminal "Tout1" and the second signal output terminal "Tout2") K in the case where the input signal is input to the first signal input terminal "Tin1" is calculated according to K=KA×KB=2Rc/Rb.

As described above, whether the switching circuit "SW" is in the on state or in the off state, the differential gain "K" of the power amplifying apparatus 200 is always fixed at 2Rc/Rb. Depending on whether the switching circuit "SW" is in the on state or in the off state, only the direct-current output potentials at the first signal output terminal "Tout1" and the second signal output terminal "Tout2" change to the intermediate voltage of the power supply potential "Vbat" or a quarter of the power supply potential "Vbat".

Next, a specific example of an operation waveform of the power amplifying apparatus 200 will be described.

Figure 13:
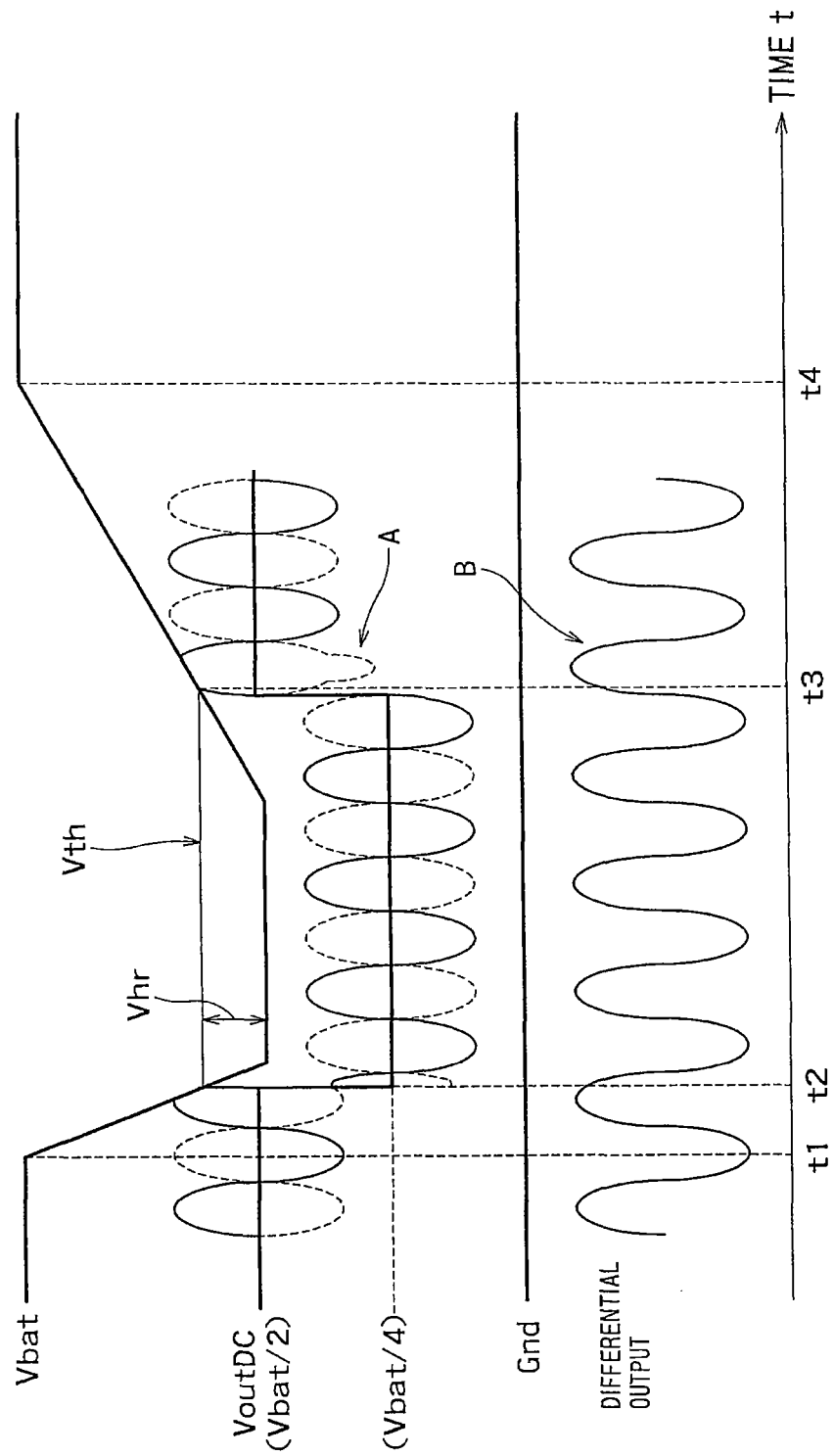
FIG. 13 is a diagram showing a specific example of the operation waveform of the power amplifying apparatus 200 according to the modification shown in FIG. 12.

FIG. 13 is a diagram showing a specific example of the operation waveform of the power amplifying apparatus 200 according to the modification shown in FIG. 12.

In this example, the switching threshold "Vth" is set as shown by the following formula (10). In the formula (10), "Vref" denotes the reference voltage, and "Vhr" denotes a fixed voltage.

$$Vth=2Vref+Vhr \quad (10)$$

In FIG. 13, the waveform of the power supply potential "Vbat" shows an instantaneous drop of the battery voltage that typically occurs when the engine that has not been idling is restarted (in a period from a time "t1" to a time "t4"). The power supply potential (battery voltage) "Vbat" is stable before the time "t1" and after the time "t4".

An output direct-current voltage "VoutDC" is the potential at the first signal output terminal "Tout1" and the second signal output terminal "Tout2".

For example, if the power supply potential "Vbat" is higher than the switching threshold "Vth" (in a period before a time "t2" and a period after a time "t3"), the mid-point potential controlling circuit 1 turns on the switching circuit "SW", and the output direct-current voltage "VoutDC" changes to a half of the power supply potential "Vbat".

On the other hand, if the power supply potential "Vbat" is lower than the switching threshold "Vth" (in a period from the time "t2" to the time "t3"), the mid-point potential controlling circuit 1 turns off the switching circuit "SW", and the output direct-current voltage "VoutDC" changes to a quarter of the power supply potential "Vbat".

Then, a positive-phase output signal and a negative-phase output signal are output at the first signal output terminal "Tout1" and the second signal output terminal "Tout2". When the waveform of the power supply potential "Vbat" shows an instantaneous drop or rise, one of the output terminals may be clipped (as shown by the arrow A in FIG. 13).

However, since the power amplifying apparatus 200 according to this modification maintain a constant differential gain, the differential outputs at the first signal output terminal "Tout1" and the second signal output terminal "Tout2" always exhibit a desired output waveform, even before and after an instantaneous drop of the battery voltage (as shown by the arrow B in FIG. 13).

As described above, the power amplifying circuit according to this modification can continue to output a desired waveform even when the power supply potential instantaneously drops.

A car audio system incorporating the power amplifying circuit according to this modification can avoid an interruption of the audio output if the battery voltage instantaneously drops because of an abrupt load change on restart of the engine that has not been idling. That is, the user does not hear any uncomfortable audio output interruption when the engine having been stopped is restarted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power amplifying apparatus, comprising:
an amplifier that amplifies an input signal input to an input terminal to produce a first amplified signal and a second amplified signal and outputs the first amplified signal at a positive-phase output terminal and the second amplified signal at a negative-phase output terminal;
a first amplifying circuit that has a first output transistor that is connected at a first end thereof to a power supply line to which a power supply potential is applied and at a second end thereof to a first output terminal at which a first output signal is output, a first current detecting circuit that detects a first current flowing through the first output transistor and outputs a first detection signal based on a result of the detection to a first detection terminal, a second output transistor that is connected to the first output terminal at a first end thereof and at a second end thereof to a ground line to which a ground potential is applied, a second current detecting circuit that detects a second current flowing through the second output transistor and outputs a second detection signal based on a result of the detection to a second detection terminal, and a first driving circuit that performs a control depending on the first amplified signal so that the first output transistor and the second output transistor are turned on and off in a complementary manner;

a second amplifying circuit that has a third output transistor that is connected at a first end thereof to the power supply line and at a second end thereof to a second output terminal at which a second output signal is output, a third current detecting circuit that detects a third current flowing through the third output transistor and outputs a third detection signal based on a result of the detection to a third detection terminal, a fourth output transistor that is connected to the second output terminal at a first end thereof and to the ground line at a second end thereof, a fourth current detecting circuit that detects a fourth current flowing through the fourth output transistor and outputs a fourth detection signal based on a result of the detection to a fourth detection terminal, and a second driving circuit that performs a control depending on the second amplified signal so that the third output transistor and the first output transistor are turned on and off in a complementary manner and the third output transistor and the fourth output transistor are turned on and off in a complementary manner;

a first comparator that compares the first detection signal and the fourth detection signal and outputs a first comparison signal depending on whether or not a difference between the first current and the fourth current is equal to or greater than a first predetermined value; and a second comparator that compares the second detection signal and the third detection signal and outputs a second comparison signal depending on whether or not a difference between the second current and the third current is equal to or greater than a second predetermined value.

2. The power amplifying apparatus according to claim 1, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the power supply potential and a first power-supply-side reference voltage lower than the power supply potential, or when the second output signal falls within a range between the power supply potential and a second power-supply-side reference voltage lower than the power supply potential.

3. The power amplifying apparatus according to claim 1, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the ground potential and a first ground-side reference voltage higher than the ground potential, or when the second output signal falls within a range between the ground potential and a second ground-side reference voltage higher than the ground potential.

4. The power amplifying apparatus according to claim 1, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the power supply potential and a first power-supply-side reference voltage lower than the power supply potential, when the second output signal falls within a range between the power supply potential and a second power-supply-side reference voltage lower than the power supply potential, when the first output signal falls within a range between the ground potential and a first ground-side reference voltage higher than the ground potential, or when the second output signal falls within a range between the ground potential and a second ground-side reference voltage higher than the ground potential.

5. The power amplifying apparatus according to claim 4, wherein the output clip detecting circuit comprises:

a first power-supply-side direct-current power supply that is connected to the power supply line at a positive electrode thereof and outputs the first power-supply-side reference voltage;

a second power-supply-side direct-current power supply that is connected to the power supply line at a positive electrode thereof and outputs the second power-supply-side reference voltage;

a first power-supply-side comparator that is connected to a negative electrode of the first power-supply-side direct-current power supply at an inverting input terminal thereof and to the first output terminal at a non-inverting input terminal thereof;

a second power-supply-side comparator that is connected to a negative electrode of the second power-supply-side direct-current power supply at an inverting input terminal thereof and to the second output terminal at a non-inverting input terminal thereof; and a NOR circuit that performs a NOR calculation of outputs of the first and second power-supply-side comparators, the NOR circuit outputting a result of the NOR calculation as the clip detection signal.

6. The power amplifying apparatus according to claim 4, wherein the output clip detecting circuit comprises:

a first ground-side direct-current power supply that is connected to the ground line at a negative electrode thereof and outputs the first ground-side reference voltage;

a second ground-side direct-current power supply that is connected to the ground line at a negative electrode thereof and outputs the second ground-side reference voltage;

a first ground-side comparator that is connected to a positive electrode of the first grounds-side direct-current power supply at a non-inverting input terminal thereof and to the first output terminal at an inverting input terminal thereof;

a second ground-side comparator that is connected to a positive electrode of the second ground-side direct-current power supply at a non-inverting input terminal thereof and to the second output terminal at an inverting input terminal thereof; and a NOR circuit that performs a NOR calculation of outputs of the first and second ground-side comparators, the NOR circuit outputting a result of the NOR calculation as the clip detection signal.

7. The power amplifying apparatus according to claim 4, wherein the output clip detecting circuit comprises:

a first power-supply-side direct-current power supply that is connected to the power supply line at a positive electrode thereof and outputs the first power-supply-side reference voltage;

a second power-supply-side direct-current power supply that is connected to the power supply line at a positive electrode thereof and outputs the second power-supply-side reference voltage;

a first power-supply-side comparator that is connected to a negative electrode of the first power-supply-side direct-current power supply at an inverting input terminal thereof and to the first output terminal at a non-inverting input terminal thereof;

a second power-supply-side comparator that is connected to a negative electrode of the second power-supply-side direct-current power supply at an inverting input terminal thereof and to the second output terminal at a non-inverting input terminal thereof;

a first ground-side direct-current power supply that is connected to the ground line at a negative electrode thereof and outputs the first ground-side reference voltage;

a second ground-side direct-current power supply that is connected to the ground line at a negative electrode thereof and outputs the second ground-side reference voltage;

a first ground-side comparator that is connected to a positive electrode of the first grounds-side direct-current power supply at a non-inverting input terminal thereof and to the first output terminal at an inverting input terminal thereof;

a second ground-side comparator that is connected to a positive electrode of the second ground-side direct-current power supply at a non-inverting input terminal thereof and to the second output terminal at an inverting input terminal thereof; and a NOR circuit that performs a NOR calculation of outputs of the first and second power-supply-side comparators and outputs of the first and second ground-side comparators, the NOR circuit outputting a result of the NOR calculation as the clip detection signal.

8. The power amplifying apparatus according to claim 1, wherein the first current detecting circuit comprises a first detecting transistor that is connected to the power supply line at a first end thereof and to the first detection terminal at a second end thereof and through which a first detection current that is a mirror of the first current flowing through the first output transistor flows, and outputs the first detection current at the first detection terminal as the first detection signal, wherein the second current detecting circuit comprises a second detecting transistor that is connected to the ground line at a first end thereof and to the second detection terminal at a second end thereof and through which a second detection current that is a mirror of the second current flowing through the second output transistor flows, and outputs the second detection current at the second detection terminal as the second detection signal, wherein the third current detecting circuit comprises a third detecting transistor that is connected to the power supply line at a first end thereof and to the third detection terminal at a second end thereof and through which a third detection current that is a mirror of the third current flowing through the third output transistor flows, and outputs the third detection current at the third detection terminal as the third detection signal, and wherein the fourth current detecting circuit comprises a fourth detecting transistor that is connected to the ground line at a first end thereof and to the fourth detection terminal at a second end thereof and through which a fourth detection current that is a mirror of the fourth current flowing through the fourth output transistor flows, and outputs the fourth detection current at the fourth detection terminal as the fourth detection signal.

9. The power amplifying apparatus according to claim 1, wherein the first comparator comprises:

an input resistor that is connected to the first detection terminal and the fourth detection terminal at a first end thereof and to a fixed potential at a second end thereof;

a direct-current power supply that is connected to the fixed potential at a first end thereof; and a comparator that is connected to the first end of the input resistor at a first input thereof and to a second end of the direct-current power supply at a second input thereof, wherein the first comparator outputs the first comparison signal depending on a signal output from the comparator.

10. The power amplifying apparatus according to claim 9, wherein the first comparator further comprises a sensitivity reducing resistor that is connected to the first end of the input resistor at a first end thereof and to the first input of the comparator and the fourth detection terminal at a second end thereof.

11. An audio system, comprising:

a power amplifying apparatus; and a speaker, wherein the power amplifying apparatus comprises:

an amplifier that amplifies an input signal input to an input terminal to produce a first amplified signal and a second amplified signal and outputs the first amplified signal at a positive-phase output terminal and the second amplified signal at a negative-phase output terminal;

a first amplifying circuit that has a first output transistor that is connected at a first end thereof to a power supply line to which a power supply potential is applied and at a second end thereof to a first output terminal at which a first output signal is output, a first current detecting circuit that detects a first current flowing through the first output transistor and outputs a first detection signal based on a result of the detection to a first detection terminal, a second output transistor that is connected to the first output terminal at a first end thereof and at a second end thereof to a ground line to which a ground potential is applied, a second current detecting circuit that detects a second current flowing through the second output transistor and outputs a second detection signal based on a result of the detection to a second detection terminal, and a first driving circuit that performs a control depending on the first amplified signal so that the first output transistor and the second output transistor are turned on and off in a complementary manner;

a second amplifying circuit that has a third output transistor that is connected at a first end thereof to the power supply line and at a second end thereof to a second output terminal at which a second output signal is output, a third current detecting circuit that detects a third current flowing through the third output transistor and outputs a third detection signal based on a result of the detection to a third detection terminal, a fourth output transistor that is connected to the second output terminal at a first end thereof and to the ground line at a second end thereof, a fourth current detecting circuit that detects a fourth current flowing through the fourth output transistor and outputs a fourth detection signal based on a result of the detection to a fourth detection terminal, and a second driving circuit that performs a control depending on the second amplified signal so that the third output transistor and the first output transistor are turned on and off in a complementary manner and the third output transistor and the fourth output transistor are turned on and off in a complementary manner;

a first comparator that compares the first detection signal and the fourth detection signal and outputs a first comparison signal depending on whether or not a difference between the first current and the fourth current is equal to or greater than a first predetermined value; and a second comparator that compares the second detection signal and the third detection signal and outputs a second comparison signal depending on whether or not a difference between the second current and the third current is equal to or greater than a second predetermined value.

12. The audio system according to claim 11, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the power supply potential and a first power-supply-side reference voltage lower than the power supply potential, or when the second output signal falls within a range between the power supply potential and a second power-supply-side reference voltage lower than the power supply potential.

13. The audio system according to claim 11, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the ground potential and a first ground-side reference voltage higher than the ground potential, or when the second output signal falls within a range between the ground potential and a second ground-side reference voltage higher than the ground potential.

14. The audio system according to claim 11, further comprising:

An output clip detecting circuit that detects the first output signal and the second output signal and outputs a clip detection signal based on a result of the detection to control the first comparator and the second comparator, wherein the output clip detecting circuit performs a control so that the first comparator does not output the first comparison signal and the second comparator does not output the second comparison signal when the first output signal falls within a range between the power supply potential and a first power-supply-side reference voltage lower than the power supply potential, when the second output signal falls within a range between the power supply potential and a second power-supply-side reference voltage lower than the power supply potential, when the first output signal falls within a range between the ground potential and a first ground-side reference voltage higher than the ground potential, or when the second output signal falls within a range between the ground potential and a second ground-side reference voltage higher than the ground potential.

15. The audio system according to claim 14, wherein the output clip detecting circuit comprises:

a first power-supply-side direct-current power supply that is connected to the power supply line at a positive electrode thereof and outputs the first power-supply-side reference voltage;

a second power-supply-side direct-current power supply that is connected to the power supply line at a positive electrode thereof and outputs the second power-supply-side reference voltage;

a first power-supply-side comparator that is connected to a negative electrode of the first power-supply-side direct-current power supply at an inverting input terminal thereof and to the first output terminal at a non-inverting input terminal thereof;

a second power-supply-side comparator that is connected to a negative electrode of the second power-supply-side direct-current power supply at an inverting input terminal thereof and to the second output terminal at a non-inverting input terminal thereof; and a NOR circuit that performs a NOR calculation of outputs of the first and second power-supply-side comparators, the NOR circuit outputting a result of the NOR calculation as the clip detection signal.

16. The audio system according to claim 14, wherein the output clip detecting circuit comprises:

a first ground-side direct-current power supply that is connected to the ground line at a negative electrode thereof and outputs the first ground-side reference voltage;

a second ground-side direct-current power supply that is connected to the ground line at a negative electrode thereof and outputs the second ground-side reference voltage;

a first ground-side comparator that is connected to a positive electrode of the first grounds-side direct-current power supply at a non-inverting input terminal thereof and to the first output terminal at an inverting input terminal thereof;

a second ground-side comparator that is connected to a positive electrode of the second ground-side direct-current power supply at a non-inverting input terminal thereof and to the second output terminal at an inverting input terminal thereof; and a NOR circuit that performs a NOR calculation of outputs of the first and second ground-side comparators, the NOR circuit outputting a result of the NOR calculation as the clip detection signal.

17. The audio system according to claim 14, wherein the output clip detecting circuit comprises:

a first power-supply-side direct-current power supply that is connected to the power supply line at a positive electrode thereof and outputs the first power-supply-side reference voltage;

a second power-supply-side direct-current power supply that is connected to the power supply line at a positive electrode thereof and outputs the second power-supply-side reference voltage;

a first power-supply-side comparator that is connected to a negative electrode of the first power-supply-side direct-current power supply at an inverting input terminal thereof and to the first output terminal at a non-inverting input terminal thereof;

a second power-supply-side comparator that is connected to a negative electrode of the second power-supply-side direct-current power supply at an inverting input terminal thereof and to the second output terminal at a non-inverting input terminal thereof;

a first ground-side direct-current power supply that is connected to the ground line at a negative electrode thereof and outputs the first ground-side reference voltage;

a second ground-side direct-current power supply that is connected to the ground line at a negative electrode thereof and outputs the second ground-side reference voltage;

a first ground-side comparator that is connected to a positive electrode of the first grounds-side direct-current power supply at a non-inverting input terminal thereof and to the first output terminal at an inverting input terminal thereof;

a second ground-side comparator that is connected to a positive electrode of the second ground-side direct-current power supply at a non-inverting input terminal thereof and to the second output terminal at an inverting input terminal thereof; and a NOR circuit that performs a NOR calculation of outputs of the first and second power-supply-side comparators and outputs of the first and second ground-side comparators, the NOR circuit outputting a result of the NOR calculation as the clip detection signal.

18. The audio system according to claim 11,
wherein the first current detecting circuit comprises a first detecting transistor that is connected to the power supply line at a first end thereof and to the first detection terminal at a second end thereof and through which a first detection current that is a mirror of the first current flowing through the first output transistor flows, and outputs the first detection current at the first detection terminal as the first detection signal, wherein the second current detecting circuit comprises a second detecting transistor that is connected to the ground line at a first end thereof and to the second detection terminal at a second end thereof and through which a second detection current that is a mirror of the second current flowing through the second output transistor flows, and outputs the second detection current at the second detection terminal as the second detection signal, wherein the third current detecting circuit comprises a third detecting transistor that is connected to the power supply line at a first end thereof and to the third detection terminal at a second end thereof and through which a third detection current that is a mirror of the third current flowing through the third output transistor flows, and outputs the third detection current at the third detection terminal as the third detection signal, and wherein the fourth current detecting circuit comprises a fourth detecting transistor that is connected to the ground line at a first end thereof and to the fourth detection terminal at a second end thereof and through which a fourth detection current that is a mirror of the fourth current flowing through the fourth output transistor flows, and outputs the fourth detection current at the fourth detection terminal as the fourth detection signal.

19. The audio system according to claim 11, wherein the first comparator comprises:
an input resistor that is connected to the first detection terminal and the fourth detection terminal at a first end thereof and to a fixed potential at a second end thereof;
a direct-current power supply that is connected to the fixed potential at a first end thereof; and
a comparator that is connected to the first end of the input resistor at a first input thereof and to a second end of the direct-current power supply at a second input thereof,
wherein the first comparator outputs the first comparison signal depending on a signal output from the comparator.

20. The audio system according to claim 19, wherein the first comparator further comprises a sensitivity reducing resistor that is connected to the first end of the input resistor at a first end thereof and to the first input of the comparator and the fourth detection terminal at a second end thereof.

* * * * *